(12) United States Patent
Murakami et al.

(10) Patent No.: US 6,623,668 B1
(45) Date of Patent: Sep. 23, 2003

(54) METHOD OF FORMING MICRO LENSES OF A SOLID-STATE IMAGE PICK-UP DEVICE

(75) Inventors: Ichiro Murakami, Tokyo (JP); Yasutaka Nakashiba, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 09/567,193

(22) Filed: May 9, 2000

(30) Foreign Application Priority Data

May 11, 1999 (JP) ............................................ 11-130590

(51) Int. Cl.[7] ................................................ B29D 11/00
(52) U.S. Cl. ........................................ 264/1.36; 264/1.7
(58) Field of Search ........................ 264/1.1, 1.7, 1.38, 264/1.36, 272.11; 427/162; 425/808

(56) References Cited

U.S. PATENT DOCUMENTS

| | | | |
|---|---|---|---|
| 5,225,935 A | * | 7/1993 | Watanabe et al. |
| 5,581,379 A | * | 12/1996 | Aoyama et al. |
| 6,129,866 A | * | 10/2000 | Hamanaka et al. ........... 264/1.7 |
| 6,361,718 B1 | * | 3/2002 | Shinmo et al. ............... 264/1.7 |

FOREIGN PATENT DOCUMENTS

| | | | |
|---|---|---|---|
| JP | 60-59752 | 12/1985 | ............ H01L/31/10 |
| JP | 4-61277 | 2/1992 | ............ H01L/27/14 |
| JP | 5-303009 | 11/1993 | ............ G02B/3/00 |
| JP | 5-326900 | 12/1993 | ............ H01L/27/14 |
| JP | 6-92658 | 4/1994 | ............ C03B/11/08 |
| JP | 6-265702 | * 9/1994 | |
| JP | 7-32117 | 2/1995 | ............ B22D/17/22 |
| JP | 7-256649 | 10/1995 | ............ B29C/33/12 |
| JP | 8-43605 | 2/1996 | ............ G02B/3/02 |
| JP | 8-72064 | 3/1996 | ............ B29C/33/38 |
| JP | 8-113616 | 5/1996 | ............ C08F/220/40 |
| JP | 10-166368 | 6/1998 | ............ B29C/33/38 |

* cited by examiner

*Primary Examiner*—Mathieu D. Vargot
(74) *Attorney, Agent, or Firm*—Hayes Soloway P.C.

(57) ABSTRACT

The present invention provides a method of forming micro lenses over a base structure of a solid state image pick-up device. The method comprises the steps of: forming a light-transmitting material layer on the base structure; and pushing a die having a die pattern against the light-transmitting material layer to transfer the die pattern of the die to the light-transmitting material layer, thereby forming micro lens patterns over the base structure.

56 Claims, 15 Drawing Sheets

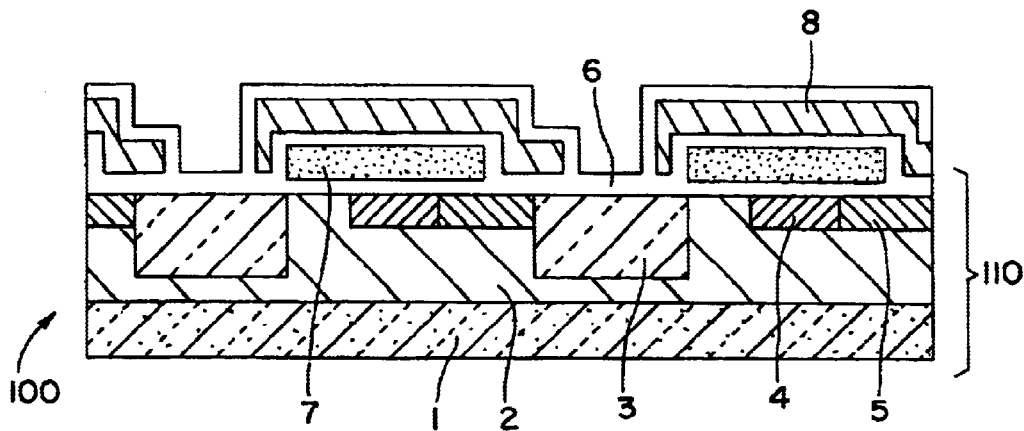
FIG. IA
PRIOR ART
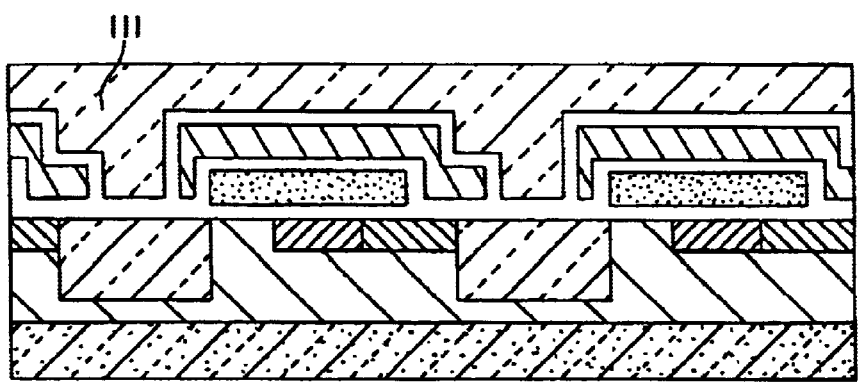
FIG. IB
PRIOR ART

METHOD OF FORMING MICRO LENSES OF A SOLID-STATE IMAGE PICK-UP DEVICE

BACKGROUND OF THE INVENTION

The present invention relates to a method of forming a solid-state image pick-up device, and more particularly to a method of forming micro lenses of a solid-state image pick-up device.

A two-dimensional charge coupled device is one of the typical solid-state image pick-up devices. The two-dimensional charge coupled device has an image pick-up region on which a plurality of photodiodes are aligned in matrix, wherein each of the photodiodes converts an optical signal into an electrical signal. A micro lens is provided over each of the photodiodes to improve sensitivity of the photodiodes. The micro lens is hemispherical-shaped. A light or a photon is transmitted through the micro lens and injected into the photodiode, whereby the light is converted into a charge which corresponds to the amount of light or photon. The generated charge is then accumulated into the photodiode.

In Japanese patent publication No. 60-59752, there is disclosed a conventional method of forming micro lenses of a solid-state image pickup device. FIGS. 1A through 1D are fragmentary cross sectional elevation views illustrative of solid-state image pick-up devices involved in a conventional method of forming an alignment of micro lenses over photodiodes of the solid-state image pick-up device, With reference to FIGS. 1A and 1D, a p-type well region 2 is formed over an n-type semiconductor substrate 1. N-type photo receiving regions 3 are selectively formed in an upper region of the p-type well region 2. N-type charge coupled device channel regions 4 are also selectively formed in the upper region of the p-type well region 2, so that the n-type charge coupled device channel regions 4 are separated from the n-type photo receiving regions 3. P+-type device isolation regions 5 are also selectively formed in the upper region of the p-type well region 2, so that each of the p+-type device isolation regions 5 is positioned in contact with the n-type charge coupled device channel region 4 and the n-type photo receiving region 3 and also positioned between the n-type charge coupled device channel region 4 and the n-type photo receiving region 3, whereby the n-type charge coupled device channel region 4 is isolated by the p+-type device isolation region 5 from the n-type photo receiving region 3. A gate oxide film 6 is formed over the upper region of the p-type well region 2, the n-type photo receiving regions 3, the n-type charge coupled device channel regions 4 and the p+-type device isolation regions 5. Polysilicon gate electrodes 7 are selectively formed on the gate oxide film 6, wherein each of the polysilicon gate electrodes 7 extends to cover the n-type charge coupled device channel region 4 and a closer half region of the p+-type device isolation regions 5 to the n-type charge coupled device channel region 4 as well as cover the upper region of the p-type well region between the n-type photo receiving region 3 and the n-type charge coupled device channel region 4. The polysilicon gate electrodes 7 do not extend to cover the n-type photo receiving region 3 and the closer half region of the p+-type device isolation region 5 to the n-type photo receiving region 3. Shielding layers 8 are formed which cover the polysilicon gate electrodes 7 and the gate oxide film 6 around the polysilicon gate electrodes 7 except over center regions of the n-type photo receiving regions 3, so as to allow lights to be injected or incident into the center regions of the n-type photo receiving regions 3. The above structure from the substrate 1 to the shielding layers 8 will hereinafter be referred to as a base region 110. A planarized insulation layer 111 is entirely formed over the base region 110. The planarized insulation layer 111 comprises either a silicon oxide layer or a transparent resin layer. The planarized insulation layer 111 is transparent to the light. Each gap between adjacent two of the shielding layers 8 is filled with the planarized insulation layer 111. A plurality of micro lenses 112 are formed on the planarized surface of the planarized insulation layer 111, so that the micro lenses 112 are positioned over the n-type photo receiving regions 3 and also over the gaps between the shielding layers 8. The light is transmitted through the micro lens 112 and the planarized insulation layer 111 in the gap between the shielding layers 8 and incident into the center region of the n-type photo receiving region 3.

The above solid-state image pickup device with the micro lenses may be formed as follows.

With reference to FIG. 1A, a p-type well region 2 is formed over an n-type semiconductor substrate 1. N-type photo receiving regions 3 are selectively formed in an upper region of the p-type well region 2. N-type charge coupled device channel regions 4 are also selectively formed in the upper region of the p-type well region 2, so that the n-type charge coupled device channel regions 4 are separated from the n-type photo receiving regions 3. P+-type device isolation regions 5 are also selectively formed in the upper region of the p-type well region 2, so that each of the p+-type device isolation regions 5 is positioned in contact with the n-type charge coupled device channel region 4 and the n-type photo receiving region 3 and also positioned between the n-type charge coupled device channel region 4 and the n-type photo receiving region 3, whereby the n-type charge coupled device channel region 4 is isolated by the p+-type device isolation region 5 from the n-type photo receiving region 3. A gate oxide film 6 is formed over the upper region of the p-type well region 2, the n-type photo receiving regions 3, the n-type charge coupled device channel regions 4 and the p+-type device isolation regions 5. Polysilicon gate electrodes 7 are selectively formed on the gate oxide film 6, wherein each of the polysilicon gate electrodes 7 extends to cover the n-type charge coupled device channel region 4 and a closer half region of the p+-type device isolation regions 5 to the n-type charge coupled device channel region 4 as well as cover the upper region of the p-type well region between the n-type photo receiving region 3 and the n-type charge coupled device channel region 4. The polysilicon gate electrodes 7 do not extend to cover the n-type photo receiving region 3 and the closer half region of the p+-type device isolation region 5 to the n-type photo receiving region 3. Shielding layers 8 are formed which cover the polysilicon gate electrodes 7 and the gate oxide film 6 around the polysilicon gate electrodes 7 except over center regions of the n-type photo receiving regions 3, so as to allow lights to be injected or incident into the center regions of the n-type photo receiving regions 3. The above structure from the substrate 1 to the shielding layers 8 will hereinafter be referred to as a base region 110.

With reference to FIG. 1B, a planarized insulation layer 111 is entirely formed over the base region 110. The planarized insulation layer 111 comprises either a silicon oxide layer or a transparent resin layer. The planarized insulation layer 111 is transparent to the light, Each gap between adjacent two of the shielding layers 8 is filled with the planarized insulation layer 111.

With reference to FIG. 1C, a transparent thermo-setting resin material as a micro lens material is applied entirely on the planarized surface of the planarized insulation layer 111. The transparent thermo-setting resin material is patterned by a photo-lithography technique to form micro lens patterns 112a which are positioned over the n-type photo receiving regions 3 and also over the gaps between the shielding layers 8.

With reference to FIG. 1D, a heat treatment is carried out to cause thermal re-flow of the micro lens patterns 112a to form micro lenses 112 on the planarized surface of the planarized insulation layer 111, so that the micro lenses 112 are positioned over the n-type photo receiving regions 3 and also over the gaps between the shielding layers 8. The light is transmitted through the micro lens 112 and the planarized insulation layer 111 in the gap between the shielding layers 8 and incident into the center region of the n-type photo receiving region 3.

As described above, the micro lenses 112 are formed by softening the micro lens patterns 112a made of the transparent thermo-setting resin material by the heat treatment. The shape of the micro lenses 112 depends upon a heat history of the micro lens material, a surface state of the planarized insulation layer 111, and a size and a thickness of the micro lens patterns 112a. Variations in temperature of the thermal re-flow process, and in size and thickness of the micro lens patterns 112a cause variation in shape of the micro lenses 112. The micro lenses 112 are made of the transparent thermo-setting resin material. This means that the micro lenses 112 are thermally unstable. It is, therefore, difficult to realize a high re-productivity of the highly accurate shaped micro lenses 112.

In Japanese laid-open patent publication No. 5-320900, it is disclosed that in order to solve the above problem, trench cavities or ridges are formed to suppress the micro lenses from spread. FIGS. 2A through 2D are fragmentary cross sectional elevation views illustrative of solid-state image pick-up devices involved in a second conventional method of forming an alignment of micro lenses over photodiodes of the solid-state image pick-up device.

With reference to FIG. 2A, a p-type well region 2 is formed over an n-type semiconductor substrate 1. N-type photo receiving regions 3 are selectively formed in an upper region of the p-type well region 2. N-type charge coupled device channel regions 4 are also selectively formed in the upper region of the p-type well region 2, so that the n-type charge coupled device channel regions 4 are separated from the n-type photo receiving regions 3. P+-type device isolation regions 5 are also selectively formed in the upper region of the p-type well region 2, so that each of the p+-type device isolation regions 5 is positioned in contact with the n-type charge coupled device channel region 4 and the n-type photo receiving region 3 and also positioned between the n-type charge coupled device channel region 4 and the n-type photo receiving region 3, whereby the n-type charge coupled device channel region 4 is isolated by the p+-type device isolation region 5 from the n-type photo receiving region 3. A gate oxide film 6 is formed over the upper region of the p-type well region 2, the n-type photo receiving regions 3, the n-type charge coupled device channel regions 4 and the p+-type device isolation regions 5. Polysilicon gate electrodes 7 are selectively formed on the gate oxide film 6, wherein each of the polysilicon gate electrodes 7 extends to cover the n-type charge coupled device channel region 4 and a closer half region of the p+-type device isolation regions 5 to the n-type charge coupled device channel region 4 as well as cover the upper region of the p-type well region 2 between the n-type photo receiving region 3 and the n-type charge coupled device channel region 4. The polysilicon gate electrodes 7 do not extend to cover the n-type photo receiving region 3 and the closer half region of the p+-type device isolation region 5 to the n-type photo receiving region 3. Shielding layers 8 are formed which cover the polysilicon gate electrodes 7 and the gate oxide film 6 around the polysilicon gate electrodes 7 except over center regions of the n-type photo receiving regions 3, so as to allow lights to be injected or incident into the center regions of the n-type photo receiving regions 3. The above structure from the substrate 1 to the shielding layers 8 will hereinafter be referred to as a base region 110. A planarized insulation layer 211 is entirely formed over the base region 110. The planarized insulation layer 211 comprises either a silicon oxide layer or a transparent resin layer. The planarized insulation layer 211 is transparent to the light. Each gap between adjacent two of the shielding layers 8 is filled with the planarized insulation layer 211, A photo-resist 13a is applied entirely over the planarized insulation layer 211. The photo-resist 13a is patterned by a photlithography to form a photo-resist pattern 13a having openings which are positioned over the n-type charge coupled device channel region 4.

With reference to FIG. 2B, the photo-resist pattern 13a is used to carry out a dry etching to the planarized insulation layer 211, so that the planarized insulation layer 211 is partially etched on boundary regions 211b to form trench cavities 221a on the boundary regions 211b of the planarized insulation layer 211. The used photo-resist pattern 13a is then removed.

With reference to FIG. 2C, a transparent thermo-setting resin material as a micro lens material is applied entirely on the planarized surface of the planarized insulation layer 211. The transparent thermo-setting resin material is patterned by a photo-lithography technique to form micro lens patterns 212a which are positioned over the top surfaces of the planarized insulation layer 211 except on adjacent regions to the trench cavities 221a and also expect over the trench cavities 221a.

With reference to FIG. 2D, a heat treatment is carried out to cause thermal re-flow of the micro lens patterns 212a to form micro lenses 212 on the top surfaces of the ridged portions of the planarized insulation layer 211. The re-flow of the micro lens patterns 212a is limited at the edge of the ridged portions of the planarized insulation layer 211. As a result, the micro lenses 212 are positioned over the n-type photo receiving regions 3 and also over the gaps between the shielding layers 8. The light is transmitted through the micro lens 212 and the planarized insulation layer 211 in the gap between the shielding layers 8 and incident into the center region of the n-type photo receiving region 3.

As described above, the edges of the ridged portion of the planarized insulation layer 211 provide a limitation to the spread of the re-flow of the micro lens patterns 212a into the top portions of the ridged portions of the planarized insulation layer 211. Namely, the micro lenses 212 are formed by softening the micro lens patterns 212a made of the transparent thermo-setting resin material by the heat treatment. Variation in shape of the micro lenses 212 is suppressed by the edges of the ridged portion of the planarized insulation layer 211.

The above second conventional method of forming the micro lens has the following problems. The isolation trench cavities 221a are provided to isolate the individual ridged regions on which the micro lenses 212 are formed, so that the edges of the isolation trench cavities 221a suppress the spread of the re-flow of the micro lens patterns 212a, whereby the micro lens 212 is limited on the ridge defined by the isolation trench cavities 221a. This means that a width "X" of the micro lens 212 is accurately defined by the width of the ridge. The width and the size of the micro lens depend upon the material of the micro lens and the temperature of the re-flow process, for which reason even the width of the micro lens is accurately controlled or decided by the width of the ridge, it is difficult to accurately control or decide the height or thickness "Y" of the micro lens. Further, if it is necessary to form size-different micro lenses over the base structure 110, then it is, however, difficult to realize the control in size differently of the micro lenses. In order to improve the sensitivity, it is effective to enlarge the size of the micro lenses and narrow the distance between the adjacent two of the micro lenses. It is, however, different to further narrow the isolation trench cavities isolating the ridges on which the micro lenses are formed. This means it difficult to further narrow the distance between the adjacent two of the micro lenses.

FIGS. 3A through 3D are fragmentary cross sectional elevation views illustrative of solid-state image pick-up devices involved in a third conventional method of forming an alignment of micro lenses over photodiodes of the solid-state image pick-up device.

With reference to FIG. 3A, a p-type well region 2 is formed over an n-type semiconductor substrate 1. N-type photo receiving regions 3 are selectively formed in an upper region of the p-type well region 2. N-type charge coupled device channel regions 4 are also selectively formed in the upper region of the p-type well region 2, so that the n-type charge coupled device channel regions 4 are separated from the n-type photo receiving regions 3. P+-type device isolation regions 5 are also selectively formed in the upper region of the p-type well region 2, so that each of the p+-type device isolation regions 5 is positioned in contact with the n-type charge coupled device channel region 4 and the n-type photo receiving region 3 and also positioned between the n-type charge coupled device channel region 4 and the n-type photo receiving region 3, whereby the n-type charge coupled device channel region 4 is isolated by the p+-type device isolation region 5 from the n-type photo receiving region 3. A gate oxide film 6 is formed over the upper region of the p-type well region 2, the n-type photo receiving regions 3, the n-type charge coupled device channel regions 4 and the p+-type device isolation regions 5. Polysilicon gate electrodes 7 are selectively formed on the gate oxide film 6, wherein each of the polysilicon gate electrodes 7 extends to cover the n-type charge coupled device channel region 4 and a closer half region of the p+-type device isolation regions 5 to the n-type charge coupled device channel region 4 as well as cover the upper region of the p-type well region between the n-type photo receiving region 3 and the n-type charge coupled device channel region 4. The polysilicon gate electrodes 7 do not extend to cover the n-type photo receiving region 3 and the closer half region of the p+-type device isolation region 5 to the n-type photo receiving region 3. Shielding layers 8 are formed which cover the polysilicon gate electrodes 7 and the gate oxide film 6 around the polysilicon gate electrodes 7 except over center regions of the n-type photo receiving regions 3, so as to allow lights to be injected or incident into the center regions of the n-type photo receiving regions 3. The above structure from the substrate 1 to the shielding layers 8 will hereinafter be referred to as a base region 110. A planarized insulation layer 211 is entirely formed over the base region 110. The planarized insulation layer 211 comprises either a silicon oxide layer or a transparent resin layer. The planarized insulation layer 211 is transparent to the light. Each gap between adjacent two of the shielding layers 8 is filled with the planarized insulation layer 211. A photo-resist 13a is applied entirely over the planarized insulation layer 211. The photo-resist 13a is patterned by a photo-lithography to form photo-resist patterns 13a which are positioned over the n-type charge coupled device channel region 4.

With reference to FIG. 3B, the photo-resist patterns 13a are used to carry out a dry etching to the planarized insulation layer 211, so that the planarized insulation layer 211 is partially etched on other regions than boundary regions 311b to form wide cavities defined between the adjacent two of the ridged portions positioned on the boundary regions 311b of the planarized insulation layer 311. The used photo-resist pattern 13a is then removed.

With reference to FIG. 3C, a transparent thermo-setting resin material as a micro lens material is applied entirely on the planarized insulation layer 311. The transparent thermo-setting resin material is patterned by a photo-lithography technique to form micro lens patterns 312a which are positioned in the wide cavities defined between the ridged portions 311a of the planarized insulation layer 311.

With reference to FIG. 3D, a heat treatment is carried out to cause thermal re-flow of the micro lens patterns 312a to form micro lenses 312 on the top surfaces of the ridged portions of the planarized insulation layer 311. The re-flow of the micro lens patterns 312a is limited at the edge of the wide cavities of the ridged portions of the planarized insulation layer 311. As a result, the micro lenses 312 are positioned over the n-type photo receiving regions 3 and also over the gaps between the shielding layers 8. The light is transmitted through the micro lens 312 and the planarized insulation layer 311 in the gap between the shielding layers 8 and incident into the center region of the n-type photo receiving region 3.

As described above, the edges of the wide cavities of the ridged portions of the planarized insulation layer 311 provide a limitation to the spread of the re-flow of the micro lens patterns 312a into the wide cavities defined between the ridged portions of the planarized insulation layer 311. Namely, the micro lenses 312 are formed by softening the micro lens patterns 312a made of the transparent thermo-setting resin material by the heat treatment. Variation in shape of the micro lenses 312 is suppressed by the edges of the wide cavities of the ridged portions of the planarized insulation layer 311.

The above third conventional method of forming the micro lens has the following problems. The ridges 311a are provided to define the individual wide cavities on which the micro lenses 312 are formed, so that the edges of the ridges 311a suppress the spread of the re-flow of the micro lens patterns 312a, whereby the micro lens 312 is limited within the wide trench cavities by the ridges 311a. This means that a width "X" of the micro lens 312 is accurately defined by the width of the wide trench cavity by the ridges 311a. The width and the size of the micro lens depend upon the material of the micro lens and the temperature of the re-flow process, for which reason even the width of the micro lens is accurately controlled or decided by the width of the wide trench cavity, it is difficult to accurately control or decide the height or thickness "Y" of the micro lens. Further, if it is necessary to form size-different micro lenses over the base structure 110, then it is, however, difficult to realize the control in size differently of the micro lenses. In order to improve the sensitivity, it is effective to enlarge the size of the micro lenses and narrow the distance between the adjacent two of the micro lenses. It is, however, different to further narrow the ridges defining the wide trench cavities on which the micro lenses are formed. This means it difficult to further narrow the distance between the adjacent two of the micro lenses.

In Japanese laid-open patent publication No. 4-61277, there is disclosed a fourth conventional method of forming micro lenses by use of dies. FIGS. 4A through 4E are fragmentary cross sectional elevation views illustrative of solid-state image pick-up devices involved in a third conventional method of forming an alignment of micro lenses over photodiodes of the solid-state image pick-up device.

With reference to FIG. 4A, a die 132 is used which has cavities 131 which are aligned so that the adjacent cavities 131 are separated from each other by ridged portions 135. The shape of each of the cavities 131 defines the shape of the each micro lens to be formed. A transparent photo-curing or thermo-setting resin material 133 as a micro lens material is injected into the die 132.

With reference to FIG. 4B, a photo-curing or thermo-setting process is carried out to form a united micro lens group 136 which comprises a thin base layered portion 135 and an alignment of micro lenses 134 on the thin base layered portion 135.

With reference to FIG. 4C, the united micro lens group 136 is removed from the die 132.

With reference to FIG. 4D, the united micro lens group 136 is placed over a color filter 138 provided over a base structure 110.

With reference to FIG. 4E, the united micro lens group 136 is adhered onto the color filter 138.

The above fourth conventional method of forming the micro lens has the following problems. The united micro lens group 136 comprises a thin base layered portion 135 and an alignment of micro lenses 134 on the thin base layered portion 135. The thickness of the united micro lens group 136 corresponds to the total thickness of the thin base layered portion 135 and the micro lenses 134. The thickness of the united micro lens group 136 is thicker by the thickness "Z" of the thin base layered portion 135 than the thickness of the individual micro lenses 134.

FIG. 5A is a view illustrative of an incidence of light through a camera lens into a solid-state image pick-up device having micro lenses formed in the fourth conventional methods illustrated in FIGS. 4A through 4E. FIG. 5B is a view illustrative of an incident of the light through micro lenses into photo-diodes of the solid-state image pick-up device in FIG. 5A.

With reference to FIGS. 5A and 5B, a solid-state image pick-up device is placed to be distanced from a camera lens 139. The solid-state image pick-up device has micro lenses 134. A light is transmitted through the camera lens 139 and further transmitted with spread toward the micro lenses 134. A center axis vertical to a plane of the base thin layered portion 135 of the micro lens group 136 penetrates a center of the camera lens 139. A micro lens 134b is positioned on the center axis. Micro lenses 134a and 134c are distanced from the center axis toward a direction included in the plane of the base thin layered portion 135 of the micro lens group 136. The light having been transmitted through the camera lens 139 is incident to the micro lens 134b at a vertical direction to the plane of the base thin layered portion 135 of the micro lens group 136. Namely, the micro lens 134b receives the vertical incidence of the light. The light having been transmitted through the camera lens 139 is incident to the micro lenses 134a and 134c at oblique directions to the plane of the base thin layered portion 135 of the micro lens group 136. Namely, the micro lenses 134a and 134c receive the oblique incidences of the lights. As described above, the thickness of the micro lens group 136 is thicker by the thickness "Z" of the base thin layered portion 135 than the micro lenses 134. The thickness "Z" of the base thin layered portion 135 increases the distance of the micro lens 134 from the photo receiving region 3. The micro lens 134b receives the vertical incident of light, whereby the light entirely reaches the photo receiving region 3. However, the micro lenses 134a and 134c receive the oblique incidents of lights, whereby the lights partially reaches the photo receiving region 3. As a result, the sensitivity is deteriorated.

The above fourth conventional method of forming the micro lenses has a further problem as follows. As illustrated in FIGS. 4A through 4E, the transparent photo-curing or thermo-setting resin material 133 as a micro lens material is injected into the die 132. Subsequently, the photo-curing or thermo-setting process is carried out to form the united micro lens group 136. The united micro lens group 136 is removed from the die 132, and then adhered onto the color filter 138 to form the solid-state image pick-up device. Since the united micro lens group 136 is prepared by the photo-curing or thermo-setting process, the united micro lens group 136 is hard, for which reason when the united micro lens group 136 is adhered onto the color filter 138, then it is possible that the color filter 138 receives a damage due to contact with the hard united micro lens group 136, whereby any wound may be formed on the color filter 138. The formed wound is projected on a screen. It may be possible to propose that in order to avoid the wound due to the contact of the color filter 138 with the hard united micro lens group 136, an outside wall is provided over the substrate for supporting the hard united micro lens group 136 which is floated from the color filter 138, so that an inter-space is formed between the hard united micro lens group 136 and the color filter 138. The inter-space is different in refractive index of light from the hard united micro lens group 136 and the color filter 138. This makes it difficult to design the shape and size of the micro lens and design the solid state image pick-up device. Further, the inter-space increases the distance between the micro lens and the photo-receiving region 3. This means decreasing the amount of the light, which have been transmitted through the micro lens 134a or 134c and reaches the photo-receiving region 3, whereby the sensitivity is further deteriorated.

In the above circumstances, it had been required to develop a novel method of micro lenses of a solid-state image pick-up device free from the above problem.

SUMMARY OF THE INVENTION

Accordingly, it is an object of the present invention to provide a novel method of micro lenses of a solid-state image pick-up device free from the above problems.

It is a further object of the present invention to provide a novel method of micro lenses of a solid-state image pick-up device, which improves an accuracy in shape and size of the micro lenses.

It is a still further object of the present invention to provide a novel method of micro lenses of a solid-state image pick-up device, which improves reliability of the solid-state image pick-up device.

It is yet a further object of the present invention to provide a novel method of micro lenses of a solid-state image pick-up devise, which improves sensitivity of the solid-state image pick-up device.

The present invention provides a method of forming micro lenses over a base structure of a solid state image pick-up device. The method comprises the steps of: forming a light-transmitting material layer on the base structure; and pushing a die having a die pattern against the light-transmitting material layer to transfer the die pattern of the die to the light-transmitting material layer, thereby forming micro lens patterns over the base structure.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

FIGS. 1A through 1D are fragmentary cross sectional elevation views illustrative of solid-state image pick-up devices involved in a conventional method of forming an alignment of micro lenses over photodiodes of the solid-state image pick-up device.

DISCLOSURE OF THE INVENTION

Figure 1C:
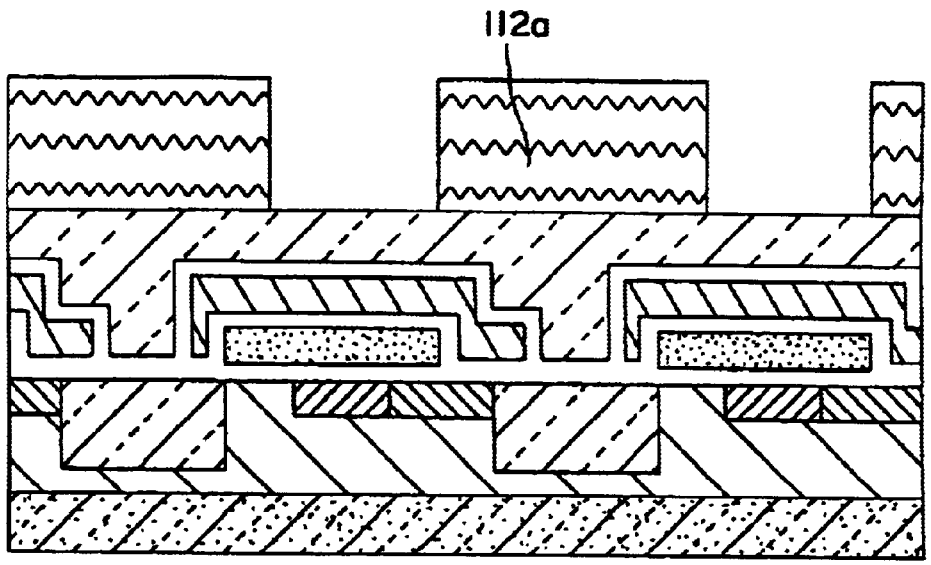
Figure 1D:
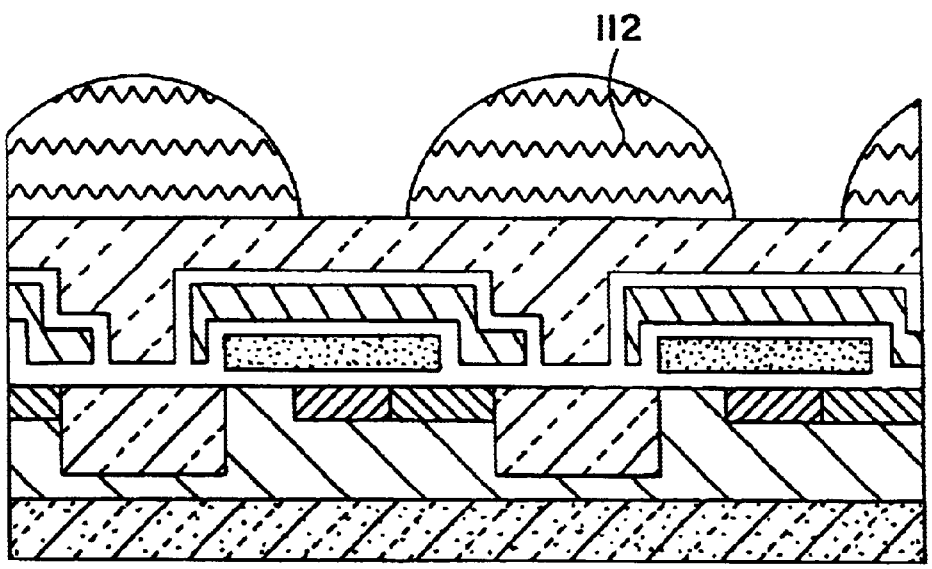
Figure 2A:
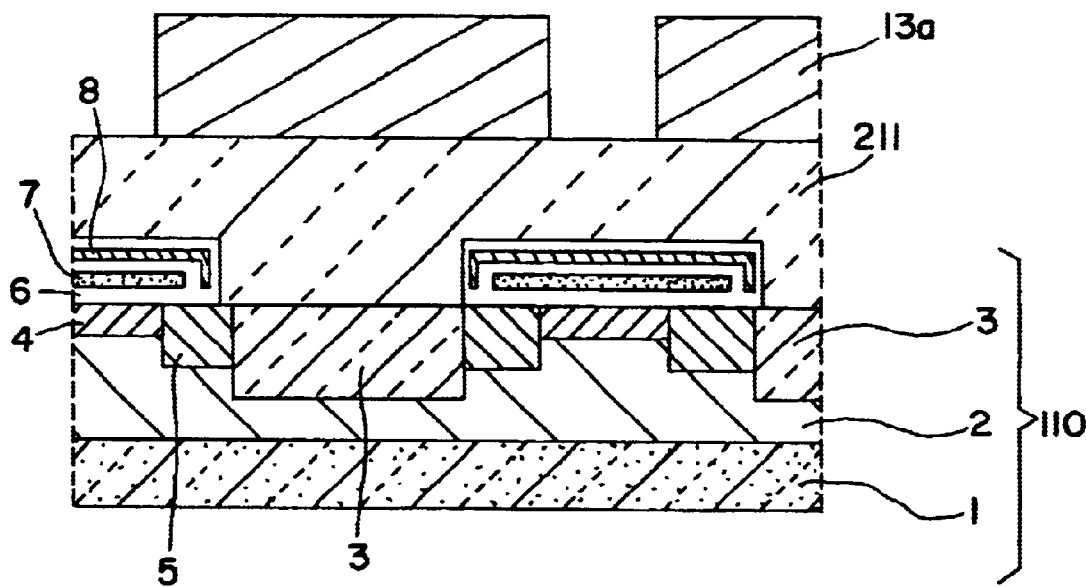
FIGS. 2A through 2D are fragmentary cross sectional elevation views illustrative of solid-state image pick-up devices involved in a second conventional method of forming an alignment of micro lenses over photodiodes of the solid-state image pick-up device.
Figure 2B:
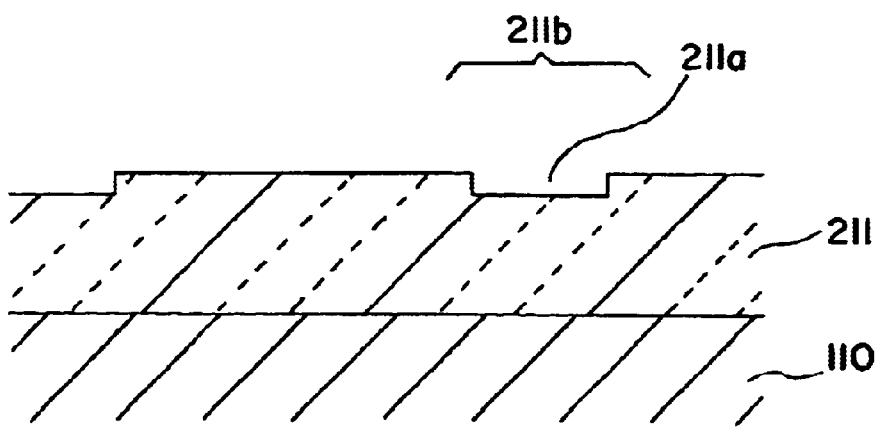
Figure 2C:
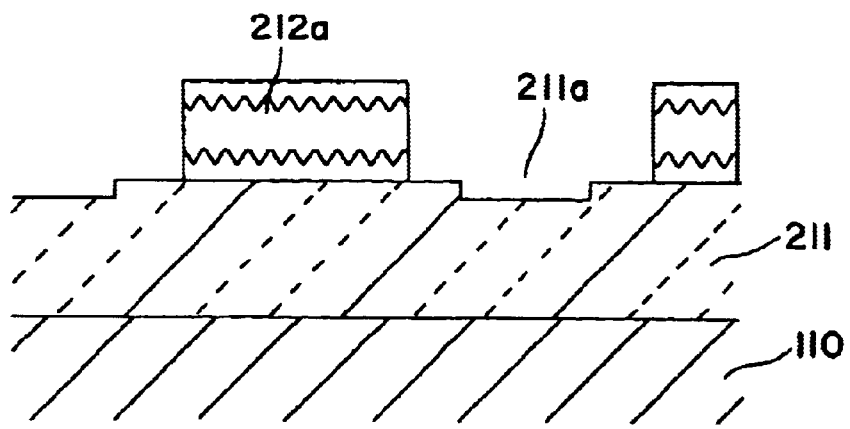
Figure 2D:
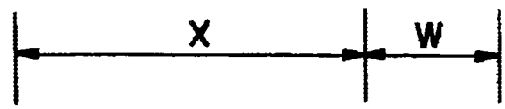
Figure 2D:
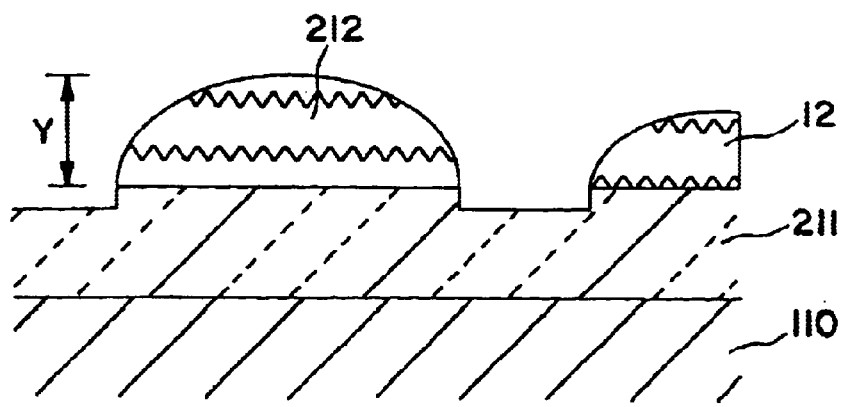
Figure 3A:
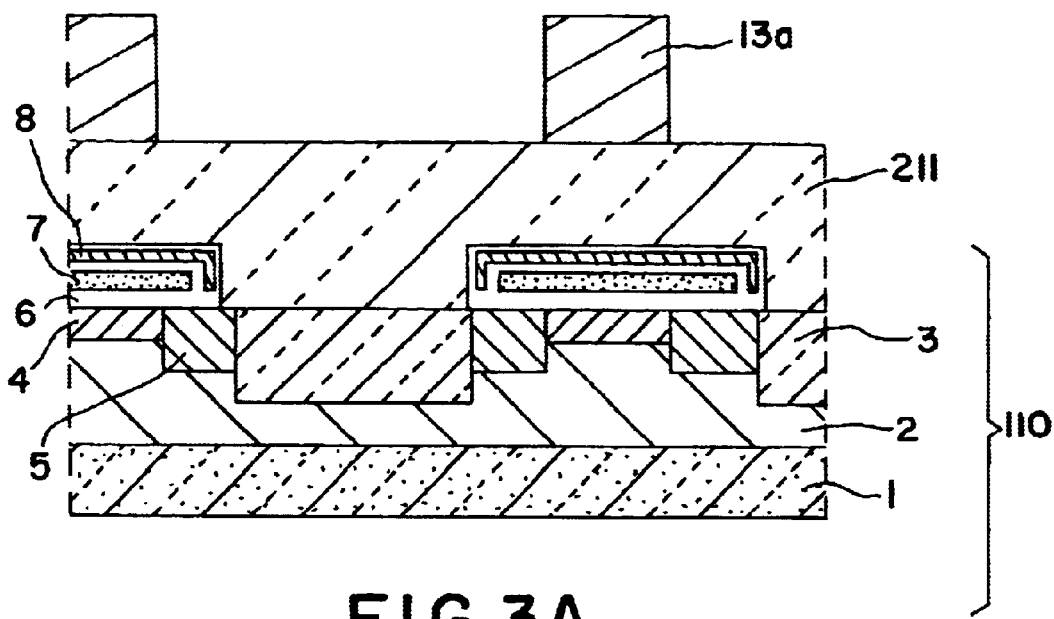
FIGS. 3A through 3D are fragmentary cross sectional elevation views illustrative of solid-state image pick-up devices involved in a third conventional method of forming an alignment of micro lenses over photodiodes of the solid-state image pick-up device.
Figure 3B:
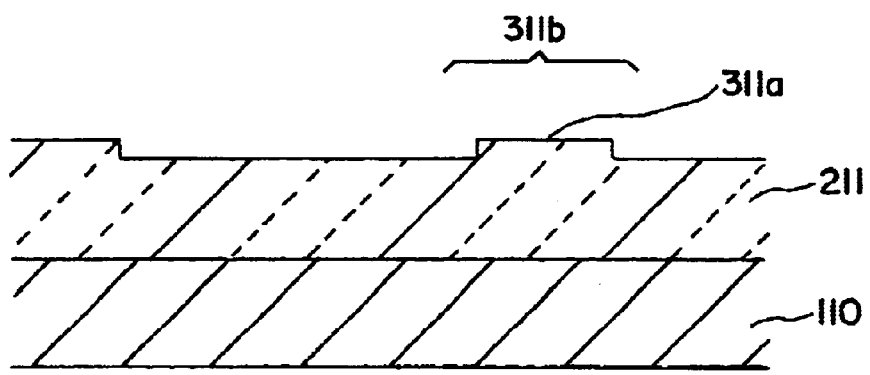
Figure 3C:
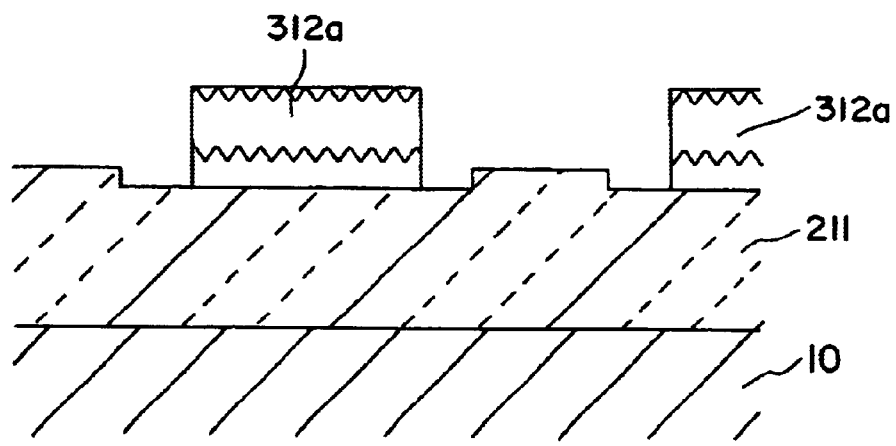
Figure 3D:
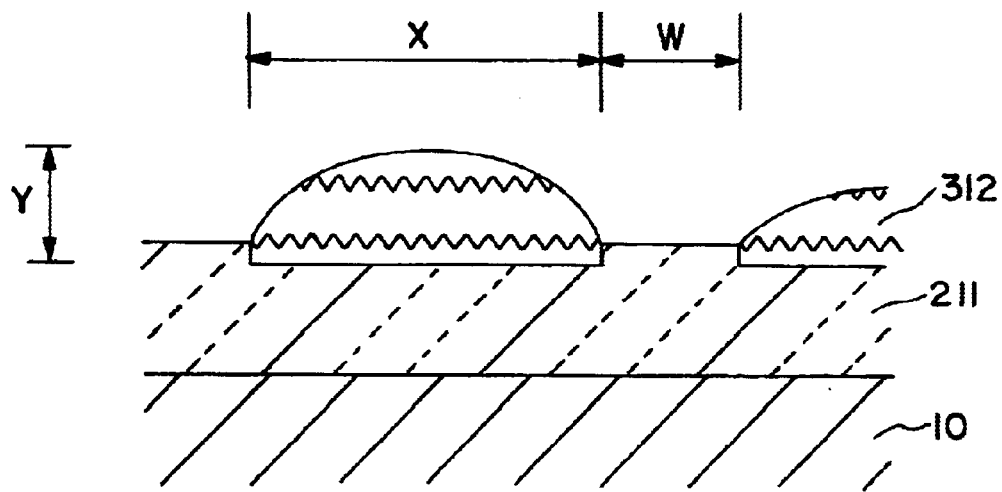
Figure 4A:
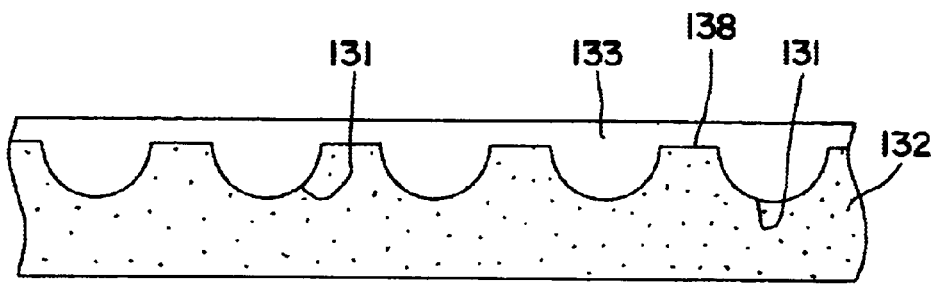
FIGS. 4A through 4E are fragmentary cross sectional elevation views illustrative of solid-state image pick-up devices involved in a third conventional method of forming an alignment of micro lenses over photodiodes of the solid-state image pick-up device.
Figure 4B:
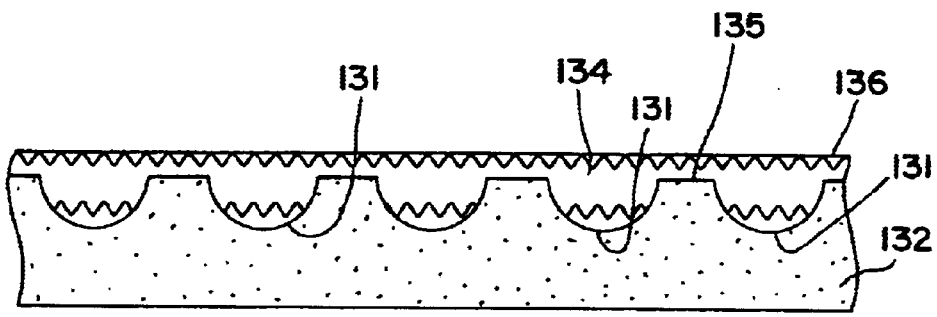
Figure 4C:
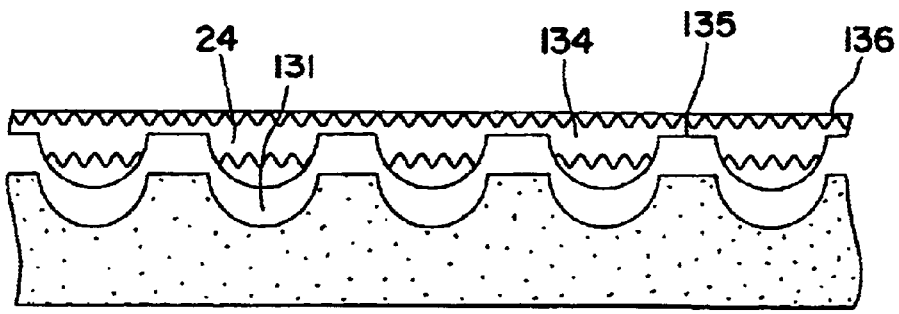
Figure 4D:
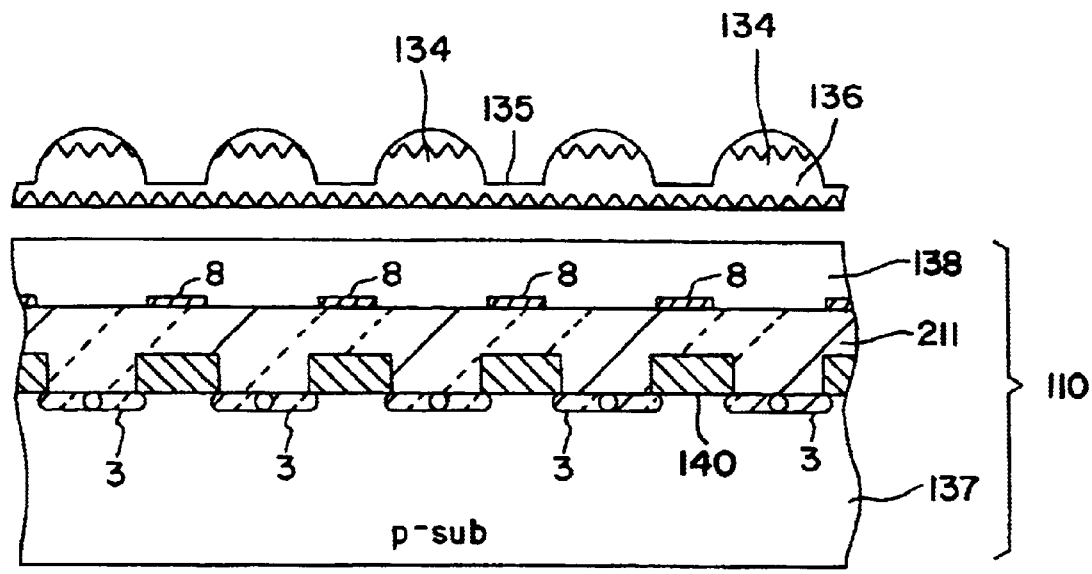
Figure 4E:
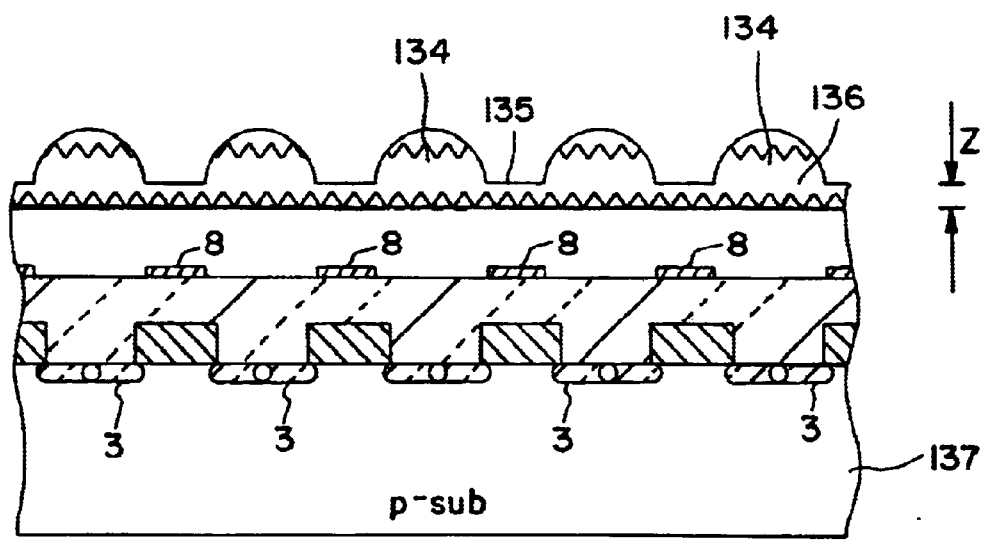

The first embodiment of the present invention provides a method of forming micro lenses over a base structure of a solid state image pick-up device. The method comprises the steps of: forming a light-transmitting material layer on the base structure; and pushing a die having a die pattern against the light-transmitting material layer to transfer the die pattern of the die to the light-transmitting material layer, thereby forming micro lens patterns over the base structure.

The pushing the die having the die pattern against the light-transmitting material layer causes the deformation of the light-transmitting material layer into the micro lens patterns which have the same pattern as the die. Namely, the shape and size of the micro lens patterns depends upon solely the shape and size of the die pattern.

No re-flow process is carried out to form the micro lens patterns or to form the micro lenses. No re-flow process causes no variation in shape and size of the micro lenses. This makes it easy to form the micro lenses having highly accurate shape and size. lenses having highly accurate shape and size.

Further, the die pattern may be a pattern to form micro lenses uniform in shape and/or size from each other, but each of the micro lenses is highly accurate in size and shape in accordance with the die pattern designed. Alternatively, the die pattern may be a pattern to form micro lenses differing in shape and/or size from each other, but each of the micro lenses is highly accurate in size and shape in accordance with the die pattern designed. Namely, it is easy to form micro lenses differing in shape and/or size from each other, but each of the micro lenses is highly accurate in size and shape in accordance with the die pattern designed.

Furthermore, the pushing the die having the die pattern against the light-transmitting material layer on the base structure of the solid-state image pick-up device results in formation of the micro lens patterns which are free of any thin base layered portion as described in the fourth conventional method. This means no increase in thickness of the micro lens patterns, resulting in no increase of the distance of the micro lens from a photo receiving region in the base structure of the solid-state image pick-up device. The micro lens positioned on or near the center axis or center position of the solid-state image pick-up device, of course, receives the vertical incident of light, whereby the light entirely reaches the photo receiving region. The reduction in distance between the micro lens and the photo receiving region in the base structure of the solid-state image pick-up device increases the amount of the oblique-incident light which reaches the photo receiving region. As a result, the reduction in distance between the micro lens and the photo receiving region in the base structure of the solid-state image pick-up device avoids any substantive deterioration in sensitivity of the solid-state image pick-up device.

It is preferable that the micro lens patterns is subjected to a thermo-setting process to form micro lenses.

Namely, the light-transmitting material layer is formed on the base structure of the solid-state image pick-up device before the die with the die pattern is pushed into the light-transmitting material layer to transfer the die pattern to the light-transmitting material layer, whereby the micro lens patterns are formed on the base structure of the solid-state image pickup device. Subsequently, the thermo-setting process is carried out for hardening the micro lens patterns in order to form the micro lenses. No adhesion or contact process is carried out for adhering or contacting the hard micro lens patterns or hard micro lens material onto the surface of the base structure of the solids-state image pick-up device. Accordingly, the micro lens patterns are securely contacted with the surface of the base structure of the solids-state image pick-up device without an adhesion or contact process. Further, the surface of the base structure of the solids-state image pick-up device receives no damage nor wound. In case, a color filter is formed on the surface region of the base structure of the solids-state image pick-up device. However, as just described here, no adhesion or contact process is carried out for adhering or contacting the hard micro lens patterns or hard micro lens material onto the surface of the base structure of the solids-state image pick-up device. Accordingly, the surface of the color filter in the base structure of the solids-state image pick-up device receives no damage nor wound. No wound is projected on the screen. It is, therefore, unnecessary to modify the structure of the solid-state image pickup device in order to avoid the wound. Namely, it is unnecessary to form or provide any outside wall over the substrate for supporting the micro lens patterns in order to space the same from the surface of the base structure of the solid-state image pick-up device or the surface of the color filter. Accordingly, no inter-space difference in refractive index of light from the micro lens patterns and the color filter is formed between the micro lens patterns and the surface of the base structure of the solid-state image pickup device or the surface of the color filter. No formation of the inter-space makes it easy to design the shape and size of the micro lens and design the solid state image pick-up device. Further, no formation of the inter-space increases the distance between the micro lens and the photo-receiving region provided in the base structure of the solid-state image pick-up device. This means no increase in thickness of the micro lens patterns, resulting in no increase of the distance of the micro lens from a photo receiving region in the base structure of the solid-state image pick-up device. The micro lens positioned on or near the center axis or center position of the solid-state image pick-up device, of course, receives the vertical incident of light, whereby the light entirely reaches the photo receiving region. The reduction in distance between the micro lens and the photo receiving region in the base structure of the solid-state image pick-up device increases the amount of the oblique-incident light which reaches the photo receiving region. As a result, the reduction in distance between the micro lens and the photo receiving region in the base structure of the solid-state image pick-up device avoids any substantive deterioration in sensitivity of the solid-state image pick-up device.

This thermo-setting process is carried out before the die is removed from the micro lenses.

Namely, during the thermo-setting process, the micro lens patterns are securely defined by the die with the die patterns corresponding to the micro lens patterns. The shape of the micro lens patterns is accurately kept by the die patterns of the die during the thermo-setting process. As a result, the micro lenses are exactly or accurately identical in shape and size with the micro lens patterns.

The thermo-setting process is carried out at a temperature in the range of 200–300° C. If the thermo-setting process is carried out at a temperature of less than 200° C., then the hardening of the micro lens patterns may be insufficient. If the thermo-setting process is cried out at a temperature of more than 300° C., then there is increased an interface state density between a semiconductor substrate and a silicon oxide film in the base structure of the solid-state image pick-up device. The increase in the interface state density on the interface causes an increase in dark current. Therefore, a yield of the solid-state image pick-up device is thus decreased. The above temperature range of 200–300° C. is preferable to obtain the effect of hardening the micro lens pattern without providing any influence to the solid-state image pick-up device, for example, without increasing the interface state density between the semiconductor substrate and the silicon oxide film in the base structure of the solid-state image pick-up device.

Alternatively, it is possibly that the micro lens patterns is subjected to a photo-curing process to form the micro lenses.

Namely, the light-transmitting material layer is formed on the base structure of the solid-state image pick-up device before the die with the die pattern is pushed into the light-transmitting material layer to transfer the die pattern to the light-transmitting material layer, whereby the micro lens patterns are formed on the base structure of the solid-state image pick-up device. Subsequently, the photo-curing process is carried out for hardening the micro lens patterns in order to form the micro lenses. No adhesion or contact process is carried out for adhering or contacting the hard micro lens patterns or hard micro lens material onto the surface of the base structure of the solids-state image pick-up device. Accordingly, the micro lens patterns are securely contacted with the surface of the base structure of the solids-state image pick-up device without an adhesion or contact process. Further, the surface of the base structure of the solids-state image pick-up device receives no damage nor wound. In this case, a color filter is formed on the surface region of the base structure of the solids-state image pick-up device. However, as just described here, no adhesion or contact process is carried out for adhering or contacting the hard micro lens patterns or hard micro lens material onto the surface of the base structure of the solids-state image pick-up device. Accordingly, the surface of the color filter in the base structure of the solids-state image pick-up device receives no damage nor wound. No wound is projected on the screen. It is, therefore, unnecessary to modify the structure of the solid-state image pickup device in order to avoid the wound. Namely, it is unnecessary to form or provide any outside wall over the substrate for supporting the micro lens patterns in order to space the same from the surface of the base structure of the solid-state image pick-up device or the surface of the color filter. Accordingly, no inter-space different in refractive index of light from the micro lens patterns and the color filter is formed between the micro lens patterns and the surface of the base structure of the solid-state image pick-up device or the surface of the color filter. No formation of the inter-space makes it easy to design the shape and size of the micro lens and design the solid state image pick-up device. Further, no formation of the inter-space increases the distance between the micro lens and the photo-receiving region provided in the base structure of the solid-state image pick-up device. This means no increase in thickness of the micro lens patterns, resulting in no increase of the distance of the micro lens from a photo receiving region in the base structure of the solid-state image pick-up device. The micro lens positioned on or near the center axis or center position of the solid-state image pick-up device, of course, receives the vertical incident of light, whereby the light entirely reaches the photo receiving region. The reduction in distance between the micro -lens and the photo receiving region in the base structure of the solid-state image pick-up device increases the amount of the oblique-incident light which reaches the photo receiving region. As a result, the reduction in distance between the micro lens and the photo receiving region in the base structure of the solid-state image pick-up device avoids any substantive deterioration in sensitivity of the solid-state image pick-up device.

The transparent organic material layer is likely to be easily deformed by pushing the die with the die pattern into the transparent organic material layer to transfer the die pattern into the transparent organic material layer thereby forming the micro lens patterns in correspondence with the die pattern. The transparent organic material layer may also be hardened by either the thermo-setting process or the photo-curing process to form the micro lenses. Namely, when the transparent organic material is used as the micro lens pattern material, then either the thermo-setting process or the photo-curing process is available.

It is preferable that the die is made of a material selected from the group consisting of tungsten, aluminum, copper, and alloys of those metals. Those substances are low in adhesiveness to the transparent organic material layer, whereby it is easy to remove the die from the transparent organic material layer.

It is convenient that the die has a plurality of cavities having corresponding patterns to the micro lens patterns, and boundary regions isolating the cavities from each other, so that the micro lenses are distanced from each other. In this case, it is preferable that the boundary regions have escape portions for allowing part of the light-transmitting material layer to be drawn into the escape portions. The escape portion may comprise a through hole. Alternatively, the escape portion may comprise a hollow portion. When the die with the die pattern corresponding to the micro lens patterns is pushed into the light-transmitting material layer to transfer the die pattern into the light-transmitting material layer, part of the light-transmitting material layer does not enter into the cavity of the die, so that the part of the light-transmitting material layer out of the cavity of the die may be drawn into the escape portions of the die. No excess part of the light-transmitting material layer is deformed or shaped by the die into the micro lens patterns, whereby the micro lens patterns are highly accurate in shape and size in accordance with the die pattern of the die.

Alternatively, it is convenient that the die has a plurality of cavities having corresponding patterns to the micro lens patterns, and boundary ridge-lines isolating the cavities from each other, so that the micro lenses are adjacent to each other. In order to improve the sensitivity, it is effective to enlarge the size of the micro lenses and narrow the distance between the adjacent two of the micro lenses. The boundary ridge-lines isolating the cavities from each other further narrow the distance between the adjacent two of the micro lenses, so that the micro lenses are adjacent to each other, thereby to improve the sensitivity of the solid-state image pick-up device.

It is also convenient that a planarized layer may be formed on the base structure before the light-transmitting material layer is then formed on the planarized layer. The light-transmitting material layer on the planarized layer is thus pushed by the die with the die pattern. This planarized surface, on which the light-transmitting material layer is formed, makes it easier to realize the highly accurate transfer of the die pattern into the light-transmitting material layer and thus to realize formation of the micro lens patterns which are highly accurate in shape and size in accordance with the die pattern of the die.

It is, of course, possible to form a color filter layer in the planarized layer to form a color type solid-state image pick-up device.

The second embodiment of the present invention provides a method of forming a solid state image pick-up device. The method comprises the steps of: forming a base structure over a semiconductor substrate, and the base structure having photo-diodes; forming a light-transmitting material layer on the base structure; and pushing a die having a die pattern against the light-transmitting material layer to transfer the die pattern of the die to the light-transmitting material layer, thereby forming micro lens patterns over the base structure.

The pushing the die having the die pattern against the light-transmitting material layer causes the deformation of the light-transmitting material layer into the micro lens patterns which have the same pattern as the die. Namely, the shape and size of the micro lens patterns depends upon solely the shape and size of the die pattern.

No re-flow process is carried out to form the micro lens patterns or to form the micro lenses. No re-flow process causes no variation in shape and size of the micro lenses. This means it easy to form the micro lenses having highly accurate shape and size.

Further, the die pattern may be a pattern to form micro lenses uniform in shape and/or size from each other, but each of the micro lenses is highly accurate in size and shape in accordance with the die pattern designed. Alternatively, the die pattern may be a pattern to form micro lenses differing in shape and/or size from each other, but each of the micro lenses is highly accurate in size and shape in accordance with the die pattern designed. Namely, it is easy to form micro lenses differing in shape and/or size from each other, but each of the micro lenses is highly accurate in size and shape in accordance with the die pattern designed.

Furthermore, the pushing the die having the die pattern against the light-transmitting material layer on the base structure of the solid-state image pick-up device results in formation of the micro lens patterns which are free of any thin base layered portion as described in the fourth conventional method. This means no increase in thickness of the micro lens patterns, resulting in no increase of the distance of the micro lens from a photo receiving region in the base structure of the solid-state image pick-up device, The micro lens positioned on or near the center axis or center position of the solid-state image pick-up device, of course, receives the vertical incident of light, whereby the light entirely reaches the photo receiving region. The reduction in distance between the micro lens and the photo receiving region in the base structure of the solid-state image pick-up device increases the amount of the oblique-incident light which reaches the photo receiving region. As a result, the reduction in distance between the micro lens and the photo receiving region in the base structure of the solid-state image pick-up device avoids any substantive deterioration in sensitivity of the solid-state image pick-up device.

It is preferable that the micro leas patterns is subjected to a thermo-setting process to form micro lenses.

Namely, the light-transmitting material layer is formed on the base structure of the solid-state image pick-up device before the die with the die pattern is pushed into the light-transmitting material layer to transfer the die pattern to the light-transmitting material layer, whereby the micro lens patterns are formed on the base structure of the solid-state image pick-up device. Subsequently, the thermo-setting process is carried out for hardening the micro lens patterns in order to form the micro lenses. No adhesion or contact process is carried out for adhering or contacting the hard micro lens patterns or hard micro lens material onto the surface of the base structure of the solids-state image pick-up device. Accordingly, the micro lens patterns are securely contacted with the surface of the base structure of the solids-state image pick-up device without an adhesion or contact process. Further, the surface of the base structure of the solids-state image pick-up device receives no damage nor wound. In this case, a color filter is formed on the surface region of the base structure of the solids-state image pick-up device. However, as just described here, no adhesion or contact process is carried out for adhering or contacting the hard micro lens patterns or hard micro lens material onto the surface of the base structure of the solids-state image pick-up device. Accordingly, the surface of the color filter in the base structure of the solids-state image pick-up device receives no damage nor wound. No wound is projected on the screen. It is, therefore, unnecessary to modify the structure of the solid-state image pickup device in order to avoid the wound. Namely, it is unnecessary to form or provide any outside wall over the substrate for supporting the micro lens patterns in order to space the same from the surface of the base structure of the solid-state image pick-up device or the surface of the color filter. Accordingly, no inter-space difference in refractive index of light from the micro lens patterns and the color filter is formed between the micro lens patterns and the surface of the base structure of the solid-state image pick-up device or the surface of the color filter. No formation of the inter-space makes it easy to design the shape and size of the micro lens and design the solid state image pick-up device. Further, no formation of the inter-space increases the distance between the micro lens and the photo-receiving region provided in the base structure of the solid-state image pick-up device. This means no increase in thickness of the micro lens patterns, resulting in no increase of the distance of the micro lens from a photo receiving region in the base structure of the solid-state image pick-up device. The micro lens positioned on or near the center axis or center position of the solid-state image pick-up device, of course, receives the vertical incident of light, whereby the light entirely reaches the photo receiving region. The reduction in distance between the micro lens and the photo receiving region in the base structure of the solid-state image pick-up device increases the amount of the oblique-incident light which reaches the photo receiving region. As a result, the reduction in distance between the micro lens and the photo receiving region in the base structure of the solid-state image pick-up device avoids any substantive deterioration in sensitivity of the solid-state image pick-up device.

This thermo-setting process is carried out before the die is removed from the micro lenses.

Namely, during the thermo-setting process, the micro lens patterns are securely defined by the die with the die patterns corresponding to the micro lens patterns. The shape of the micro lens patterns is accurately kept by the die patterns of the die during the thermo-setting process. As a result, the micro lenses are exactly or accurately identical in shape and size with the micro lens patterns.

The thermo-setting process is cared out at a temperature in the range of 200–300° C. If the thermo-setting process is carried out at a temperature of less than 200° C., then the hardening of the micro lens patterns may be insufficient. If the thermo-setting process is carried out at a temperature of more than 300° C., then there is increased an interface state density between a semiconductor substrate and a silicon oxide film in the base structure of the solid-state image pick-up device. The increase in the interface state density on the interface causes an increase in dark current. Therefore, a yield of the solid-state image pick-up device is thus decreased. The above temperature range of 200–300° C. is preferable to obtain the effect of hardening the micro lens pattern without providing any influence to the solid-state image pick-up device, for example, without increasing the interface state density between the semiconductor substrate and the silicon oxide film in the base structure of the solid-state image pick-up device.

Alternatively, it is possibly that the micro lens patterns is subjected to a photo-curing process to form the micro lenses.

Namely, the light-transmitting material layer is formed on the base structure of the solid-state image pick-up device before the die with the die pattern is pushed into the light-transmitting material layer to transfer the die pattern to the light-transmitting material layer, whereby the micro lens patterns are formed on the base structure of the solid-state image pickup device. Subsequently, the photo-curing process is carried out for hardening the micro lens patterns in order to form the micro lenses. No adhesion or contact process is carried out for adhering or contacting the hard micro lens patterns or hard micro lens material onto the surface of the base structure of the solids-state image pick-up device. Accordingly, the micro lens patterns are securely contacted with the surface of the base structure of the solids-state image pick-up device without an adhesion or contact process. Further, the surface of the base structure of the solids-state image pick-up device receives no damage nor wound. In this case, a color filter is formed on the surface region of the base structure of the solids-state image pick-up device. However, as just described here, no adhesion or contact process is carried out for adhering or contacting the hard micro lens patterns or hard micro lens material onto the surface of the base structure of the solids-state image pick-up device. Accordingly, the surface of the color filter in the base structure of the solids-state image pick-up device receives no damage nor wound. No wound is projected on the screen. It is, therefore, unnecessary to modify the structure of the solid-state image pickup device in order to avoid the wound. Namely, it is unnecessary to form or provide any outside wall over the substrate for supporting the micro lens patterns in order to space the same from the surface of the base structure of the solid-state image pick-up device or the surface of the color filter. Accordingly, no inter-space different in refractive index of light from the micro lens patterns and the color filter is formed between the micro lens patterns and the surface of the base structure of the solid-state image pickup device or the surface of the color filter. No formation of the inter-space makes it easy to design the shape and size of the micro lens and design the solid state image pick-up device. Further, no formation of the inter-space increases the distance between the micro lens and the photo-receiving region provided in the base structure of the solid-state image pick-up device. This means no increase in thickness of the micro lens patterns, resulting in no increase of the distance of the micro lens from a photo receiving region in the base structure of the solid-state image pick-up device. The micro lens positioned on or near the center axis or center position of the solid-state image pick-up device, of course, receives the vertical incident of light, whereby the light entirely reaches the photo receiving region. The reduction in distance between the micro lens and the photo receiving region in the base structure of the solid-state image pick-up device increases the amount of the oblique-incident light which reaches the photo receiving region. As a result, the reduction in distance between the micro lens and the photo receiving region in the base structure of the solid-state image pick-up device avoids any substantive deterioration in sensitivity of the solid-state image pick-up device.

The light-transmitting material layer may preferably comprise a transparent organic material layer.

The transparent organic material layer is likely to be easily deformed by pushing the die with the die pattern into the transparent organic material layer to transfer the die pattern into the transparent organic material layer thereby forming the micro lens patterns in correspondence with the die pattern. The transparent organic material layer may also be hardened by either the thermo-setting process or the photo-curing process to form the micro lenses. Namely, when the transparent organic material is used as the micro lens pattern material, then either the thermo-setting process or the photo-curing process is available. It is preferable that the die is made of a material selected from the group consisting of tungsten, aluminum, copper, and alloys of those metals. Those substances are low in adhesiveness to the transparent organic material layer, whereby it is easy to remove the die from the transparent organic material layer.

It is convenient that the die has a plurality of cavities having corresponding patterns to the micro lens patterns, and boundary regions isolating the cavities from each other, so that the micro lenses are distanced from each other. In this case, it is preferable that the boundary regions have escape portions for allowing part of the light-transmitting material layer to be drawn into the escape portions. The escape portion may comprise a through hole. Alternatively, the escape portion may comprise a hollow portion. When the die with the die pattern corresponding to the micro lens patterns is pushed into the light-transmitting material layer to transfer the die pattern into the light-transmitting material layer, part of the light transmitting material layer does not enter into the cavity of the die, so that the part of the light-transmitting material layer out of the cavity of the die may be drawn into the escape portions of the die. No excess part of the light-transmitting material layer is deformed or shaped by the die into the micro lens patterns, whereby the micro lens patterns are highly accurate in shape and size in accordance with the die pattern of the die.

Alternatively, it is convenient that the die has a plurality of cavities having corresponding patterns to the micro lens patterns, and boundary ridge-lines isolating the cavities from each other, so that the micro lenses are adjacent to each other. In order to improve the sensitivity, it is effective to enlarge the size of the micro lenses and narrow the distance between the adjacent two of the micro lenses. The boundary ridge-lines isolating the cavities from each other further narrow the distance between the adjacent two of the micro lenses, so that the micro lenses are adjacent to each other, thereby to improve the sensitivity of the solid-state image pick-up device.

It is also convenient that a planarized layer may be formed on the base structure before the light-transmitting material layer is then formed on the planarized layer. The light-transmitting material layer on the planarized layer is thus pushed by the die with the die pattern. This planarized surface, on which the light-transmitting material layer is formed, makes it easier to realize the highly accurate transfer of the die pattern into the light-transmitting material layer and thus to realize formation of the micro lens patterns which are highly accurate in shape and size in accordance with the die pattern of the die.

It is, of course, possible to form a color filer layer in the planarized layer to form a color type solid-state image pick-up device.

The third embodiment of the present invention provides a die to be used to form micro lens patterns over a base structure of a solid-state image pick-up device, the die having a plurality of cavities having corresponding patterns to the micro lens patterns, and boundary regions isolating the cavities from each other, so that the micro lenses are distanced from each other, wherein the die is made of a material selected from the group consisting of tungsten, aluminum, copper, and alloys of those metals. The die is made of a material selected from the group consisting of tungsten, aluminum, copper, alloys of those metals. Those substances are low in adhesiveness to the transparent organic material layer, whereby it is easy to remove the die from the transparent organic material layer.

It is convenient that the die has a plurality of cavities having corresponding patterns to the micro lens patterns, and boundary regions isolating the cavities from each other, so that the micro lenses are distanced from each other. In this case, it is preferable that the boundary regions have escape portions for allowing part of the light-transmitting material layer to be drawn into the escape portions. The escape portion may comprise a through hole. Alternatively, the escape portion may comprise a hollow portion. When the die with the die pattern corresponding to the micro lens patterns is pushed into the light-transmitting material layer to transfer the die pattern into the light-transmitting material layer, part of the light-transmitting material layer does not enter into the cavity of the die, so that the part of the light-transmitting material layer out of the cavity of the die may be drawn into the escape portions of the die. No excess part of the light-transmitting material layer is deformed or shaped by the die into the micro lens patterns, whereby the micro lens patterns are highly accurate in shape and size in accordance with the die pattern of the die.

The third embodiment of the present invention provides a die to be used to form micro lens patterns over a base structure of a solid-state image pick-up device, the die having a plurality of cavities having corresponding patterns to the micro lens patterns, and boundary ridge-lines isolating the cavities from each other, so that the micro lenses are adjacent to each other, wherein the die is made of a material selected from the group consisting of tungsten, aluminum, copper, and alloys of those metals.

In order to improve the sensitivity, it is effective to enlarge the size of the micro lenses and narrow the distance between the adjacent two of the micro lenses. The boundary ridge-lines isolating the cavities from each other further narrow the distance between the adjacent two of the micro lenses, so that the micro lenses are adjacent to each other, thereby to improve the sensitivity of the solid-state image pick-up device.

PREFERRED EMBODIMENT

FIRST EMBODIMENT

A first embodiment according to the present invention will be described in detail with reference to the drawings. FIGS. 6A through 6D are fragmentary cross sectional elevation views illustrative of solid-state image pick-up devices involved in a first method of forming an alignment of micro lenses over a base structure of the solid-state image pick-up device by use of a first novel die in a first preferred embodiment in accordance with the present invention.

Figure 6A:
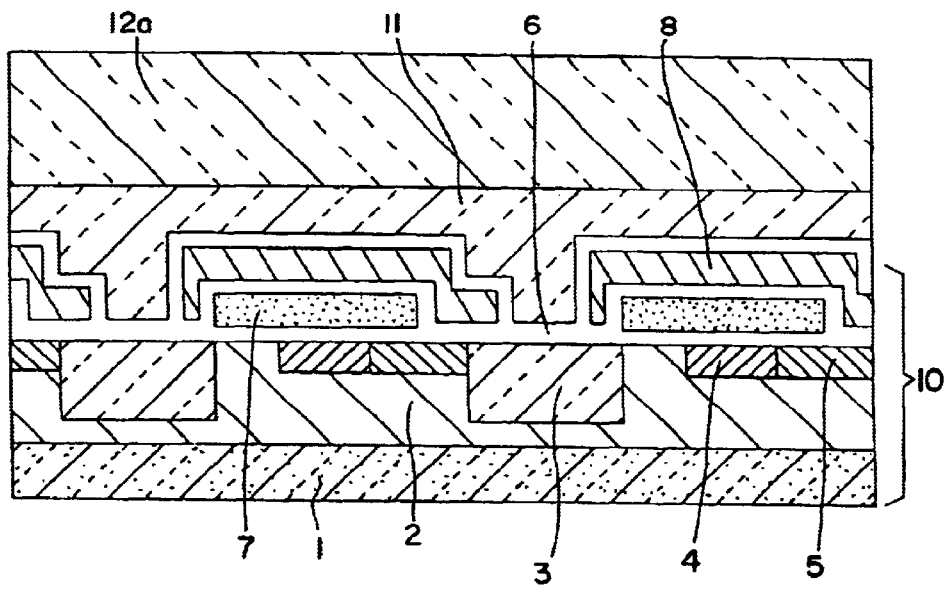
FIGS. 6A through 6D are fragmentary cross sectional elevation views illustrative of solid-state image pick-up devices involved in a first method of forming an alignment of micro lenses over a base structure of the solid-state image pick-up device by use of a first novel die in a first preferred embodiment in accordance with the present invention.

With reference to FIG. 6A, a p-type well region 2 is formed over an n-type semiconductor substrate 1. N-type photo receiving regions 3 are selectively formed in an upper region of the p-type well region 2. N-type charge coupled device channel regions 4 are also selectively formed in the upper region of the p-type well region 2, so that the n-type charge coupled device channel regions 4 are separated from the n-type photo receiving regions 3. P+-type device isolation regions 5 are also selectively formed in the upper region of the p-type well region 2, so that each of the p+-type device isolation regions 5 is positioned in contact with the n-type charge coupled device channel region 4 and the n-type photo receiving region 3 and also positioned between the n-type charge coupled device channel region 4 and the n-type photo receiving region 3, whereby the n-type charge coupled device channel region 4 is isolated by the p+-type device isolation region from the n-type photo receiving region 3. A gate oxide film 6 is formed over the upper region of the p-type well region 2, the n-type photo receiving regions 3, the n-type charge coupled device channel regions 4 and the p+-type device isolation regions 5. Polysilicon gate electrodes 7 are selectively formed on the gate oxide film 6, wherein each of the polysilicon gate electrodes 7 extends to cover the n-type charge coupled device channel region 4 and a closer half region of the p+type device isolation regions 5 to the n-type charge coupled device channel region 4 as well as cover the upper region of the p-type well region between the n-type photo receiving region 3 and the n-type charge coupled device channel region 4. The polysilicon gate electrodes 7 do not extend to cover the n-type photo receiving region 3 and the closer half region of the p+-type device isolation region 5 to the n-type photo receiving region 3. Shielding layers 8 are formed which cover the polysilicon gate electrodes 7 and the gate oxide film 6 around the polysilicon gate electrodes 7 except over center regions of the n-type photo receiving regions 3, so as to allow lights to be injected or incident into the center regions of the n-type photo receiving regions 3. The above structure from the substrate 1 to the shielding layers 8 will hereinafter be referred to as a base structure 10. A planarized insulation layer 11 is entirely formed over the base structure 10. The planarized insulation layer 11 may comprise either a silicon oxide layer or a transparent resin layer. The planarized insulation layer 11 is transparent to the light. Each gap between adjacent two of the shielding layers 8 is filled with the planarized insulation layer 11.

Further, a light-transmitting material layer 12a is formed on the planarized insulation layer 11. The light-transmitting material layer 12a may preferably comprise a transparent organic material layer, for example, a phenol novolak resin layer, a polyurethane resin layer, a polystyrene rein layer, a styrene-butadiene co-polymer rein layer, a polynorbornane resin layer, and a gelatin-casein layer.

Figure 6B:
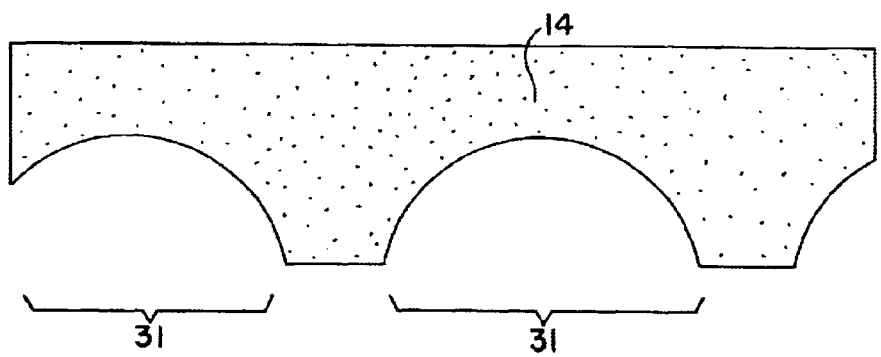
Figure 6B:
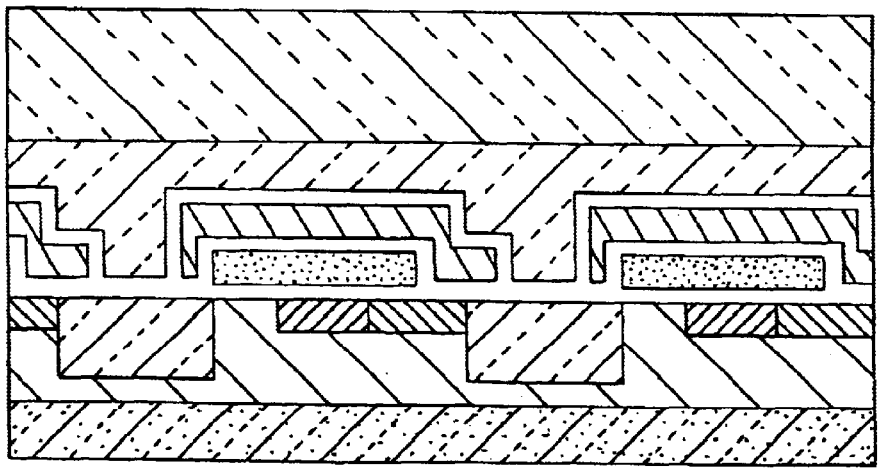

With reference to FIG. 6B, a die 14 having a die pattern is prepared. The die 14 is made of a material selected from the group consisting of tungsten, aluminum, copper, and alloys of those metals. Those substances are low in adhesiveness to the transparent organic material layer, whereby it is easy to remove the die 14 from the transparent organic material layer.

It is also convenient that a planarized layer may be formed on the base structure before the light-transmitting material layer 12a is then formed on the planarized layer. The die 14 has a plurality of cavities having corresponding patterns to the micro lens patterns 12b, and boundary regions isolating the cavities from each other.

Figure 6C:
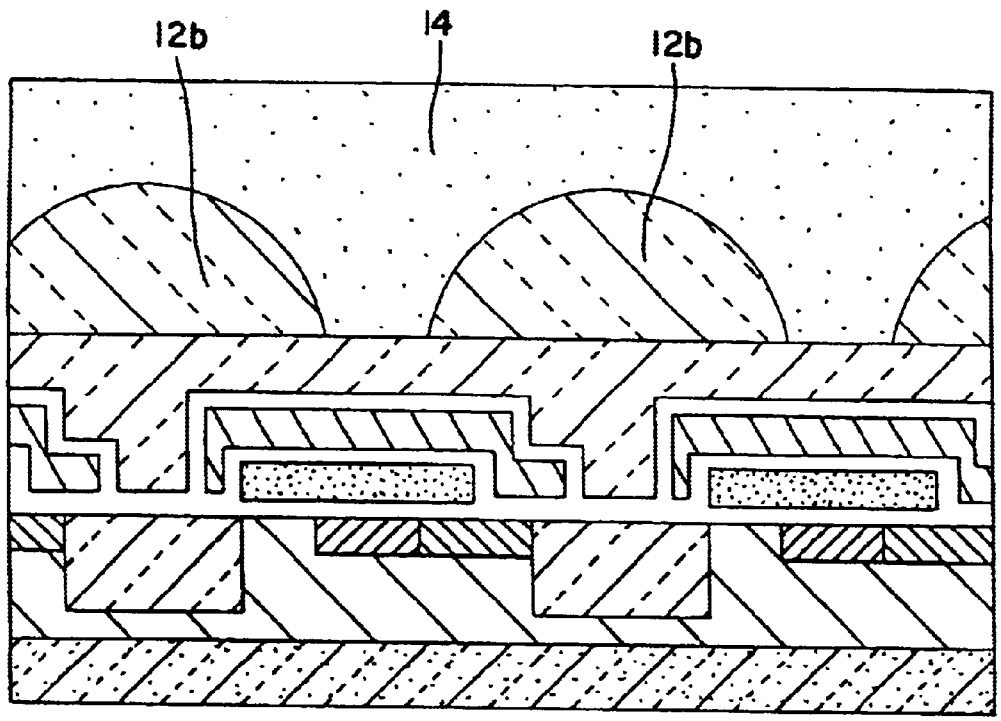

With reference to FIG. 6C, the die 14 having the die pattern is pushed against the light-transmitting material layer 12a to transfer the die pattern of the die 14 to the light-transmitting material layer 12a, thereby forming micro lens patterns 12b over the planarized insulation layer 11.

Figure 6D:
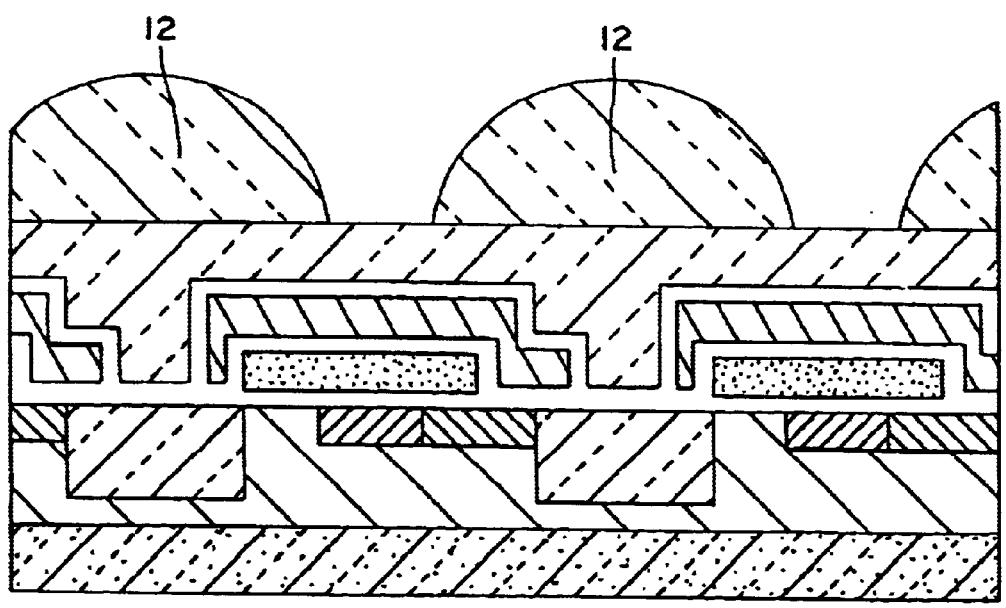

With reference to FIG. 6D, the micro lens patterns 12b are subjected to a thermo-setting process to form micro lenses 12. The thermo-setting process is carried out at a temperature in the range of 200–300° C. Alternatively, it is possible that the micro lens patterns 12b are subjected to a photo-curing process to form the micro lenses 12. Thereafter, the die 14 is removed from the micro lenses 12.

Pushing the die 14 having the die pattern against the light-transmitting material layer 12a causes the deformation of the light-transmitting material layer 12a into the micro lens patterns 12b which have the same pattern as the die 14. Namely, the shape and size of the micro lens patterns 12b depends upon solely the shape and size of the die pattern.

No re-flow process is carried out to form the micro lens patterns 12b or to form the micro lenses 12. No re-flow process causes no variation in shape and size of the micro lenses 12. This means it easy to form the micro lenses 12 having highly accurate shape and size.

Further, the die pattern is to form micro lenses 12 uniform in shape and/or size from each other, but each of the micro lenses 12 is highly accurate in size and shape in accordance with the die pattern designed, Notwithstanding, it is also possible that the die pattern may be a pattern to form micro lenses 12 differing in shape and/or size from each other, but each of the micro lenses 12 is highly accurate in size and shape in accordance with the die pattern designed. Namely, it is easy to form micro lenses 12 differing in shape and/or size from each other, but each of the micro lenses 12 is highly accurate in size and shape in accordance with the die pattern designed.

Furthermore, pushing the die 14 having the die pattern against the light-transmitting material layer 12a on the base structure of the solid-state image pick-up device results in formation of the micro lens patterns 12b which are free of any thin base layered portion as described in the fourth conventional method. This means no increase in thickness of the micro lens patterns 12b, resulting in no increase of the distance of the micro lens from a photo receiving region in the base structure of the solid-state image pick-up device. The micro lens positioned on or near the center axis or center position of the solid-state image pick-up device, of course, receives the vertical incident of light, whereby the light entirely reaches the photo receiving region. The reduction in distance between the micro lens and the photo receiving region in the base structure of the solid-state image pick-up device increases the amount of the oblique-incident light which reaches the photo receiving region. As a result, the reduction in distance between the micro lens and the photo receiving region in the base structure of the solid-state image pick-up device avoids any substantive deterioration in sensitivity of the solid-state image pick-up device.

The light-transmitting material layer 12a is formed on the 15 planarized layer 11 of the solid-state image pick-up device before the die 14 with the die pattern is pushed into the light-transmitting material layer 12a to transfer the die pattern to the light-transmitting material layer 12a, whereby the micro lens patterns 12b are formed on the base structure of the solid-state image pick-up device. Subsequently, the thermo-setting process is carried out for hardening the micro lens patterns 12b in order to form the micro lenses 12. No adhesion or contact process is carried out for adhering or contacting the hard micro lens patterns 12b or hard micro lens material onto the surface of the base structure of the solids-state image pick-up device. Accordingly, the micro lens patterns 12b are securely contacted with the surface of the base structure of the solids-state image pick-up device without an adhesion or contact process. Further, surface of the base structure of the solids-state image pick-up device receives no damage nor wound. In case, a color filter is formed on the surface region of the base structure of the solids-state image pick-up device. However, as just described here, no adhesion or contact process is carried out for adhering or contacting the hard micro lens patterns 12b or hard micro lens material onto the surface of the base structure of the solids-state image pick-up device. Accordingly, surface of the color filter in the base structure of the solids-state image pick-up device receives no damage nor wound. No wound is projected on the screen. It is, therefore, unnecessary to modify the structure of the solid-state image pick-up device in order to avoid the wound. Namely, it is unnecessary to form or provide any outside wall over the substrate for supporting the micro lens patterns 12b, in order to space the same from the surface of the base structure of the solid-state image pick-up device or the surface of the color filter. Accordingly, no inter-space different in refractive index of light from the micro lens patterns 12b and the color filter is formed between the micro lens patterns 12b and the surface of the base structure of the solid-state image pick-up device or the surface of the color filter. No formation of the inter-space makes it easy to design the shape and size of the micro lens and design the solid state image pick-up device. Further, no formation of the inter-space increases the distance between the micro lens and the photo-receiving region provided in the base structure of the solid-state image pick-up device. This means no increase in thickness of the micro lens patterns 12b, resulting in no increase of the distance of the micro lens from a photo receiving region in the base structure of the solid-state image pick-up device. The micro lens positioned on or near the center axis or center position of the solid-state image pick-up -device, of course, receives the vertical incident of light, whereby the light entirely reaches the photo receiving region. The reduction in distance between the micro lens and the photo receiving region in the base structure of the solid-state image pick-up device increases the amount of the oblique-incident light which reaches the photo receiving region. As a result, the reduction in distance between the micro lens and the photo receiving region in the base structure of the solid-state image pick-up device avoids any substantive deterioration in sensitivity of the solid-state image pick-up device.

During the thermo-setting process, the micro lens patterns 12b are securely defined by the die 14 with the die patterns corresponding to the micro lens patterns 12b. The shape of the micro lens patterns 12b are accurately kept by the die patterns of the die 14 during the thermo-setting process. As a result, the micro lenses 12 are exactly or accurately identical in shape and size with the micro lens patterns 12b.

The thermo-setting process is carried out at a temperature in the range of 200–300° C. If the thermo-setting process is carried out at a temperature of less than 200° C., then the hardening of the micro lens patterns 12b may be insufficient. If the thermo-setting process is carried out at a temperature of more than 300° C., then there is increased an interface state density between a semiconductor substrate and a silicon oxide film in the base structure of the solid-state image pick-up device. The increase in the interface state density on the interface causes an increase in dark current. Therefore, a yield of the solid-state image pick-up device is thus decreased. The above temperature range of 200–300° C. is preferable to obtain the effect of hardening the micro lens pattern without providing any influence to the solid-state image pick-up device, for example, without increasing the interface state density between the semiconductor substrate and the silicon oxide film in the base structure of the solid-state image pick-up device.

In place of the above thermo-setting process, it possible to carry out the photo-curing process for hardening the micro lens patterns 12b in order to form the micro lenses 12. No adhesion or contact process is carried out for adhering or contacting the hard micro lens patterns 12b or hard micro lens material onto the surface of the planarized layer 11 in the base structure 10 of the solids-state image pick-up device. Accordingly, the micro lens patterns 12b are securely contacted with the surface of the base structure of the solids-state image pick-up device without an adhesion or contact process. Further, surface of the base structure of the solids-state image pick-up device receives no damage nor wound. In case, a color filter may optionally be formed in the planarized layer 11 in the base structure 10 of the solids-state image pick-up device. It is also possible that in place of the planarized layer 11, the color filter is formed on the surface of the base structure 10 of the solids-state image pick-up device. However, as just described here, no adhesion or contact process is carried out for adhering or contacting the hard micro lens patterns 12b or hard micro lens material onto the surface of the base structure of the solids-state image pick-up device. Accordingly, surface of the color filter in the base structure of the solids-state image pick-up device receives no damage nor wound. No wound is projected on the screen. It is, therefore, unnecessary to modify the structure of the solid-state image pick-up device in order to avoid the wound. Namely, it is unnecessary to form or provide any outside wall over the substrate for supporting the micro lens patterns 12b in order to space the same from the surface of the base structure of the solid-state image pick-up device or the surface of the color filter. Accordingly, no inter-space different in refractive index of light from the micro lens patterns 12b and the color filter is formed between the micro lens patterns 12b and the surface of the base structure of the solid-state image pick-up device or the surface of the color filter. No formation of the inter-space makes it easy to design the shape and size of the micro lens and design the solid state image pick-up device. Further, no formation of the inter-space increases the distance between the micro lens and the photo-receiving region provided in the base structure 10 of the solid-state image pick-up device. This means no increase in thickness of the micro lens patterns 12b, resulting in no increase of the distance of the micro lens from a photo receiving region in the base structure 10 of the solid-state image pick-up device. The micro lens positioned on or near the center axis or center position of the solid-state image pick-up device, of course, receives the vertical incident of light, whereby the light entirely reaches the photo receiving region 3. The reduction in distance between the micro lens 12 and the photo receiving region 3 in the base structure 10 of the solid-state image pick-up device increases the amount of the oblique-incident light which reaches the photo receiving region 3. As a result, the reduction in distance between the micro lens 12 and the photo receiving region 3 in the base structure of the solid-state image pick-up device avoids any substantive deterioration in sensitivity of the solid-state image pick-up device.

The light-transmitting material layer 12a on the planarized layer is thus pushed by the die 14 with the die pattern. This planarized surface, on which the light-transmitting material layer is formed, makes it easier to realize the highly accurate transfer of the die pattern into the light-transmitting material layer 12a and thus to realize formation of the micro lens patterns 12b which are highly accurate in shape and size in accordance with the die pattern of the die 14.

SECOND EMBODIMENT

A second embodiment according to the present invention will be described in detail with reference to the drawings. FIGS. 7A through 7D are fragmentary cross sectional elevation views illustrative of solid-state image pick-up devices involved in a first method of forming an alignment of micro lenses over a base structure of the solid-state image pick-up device by use of a second novel die in a second preferred embodiment in accordance with the present invention. This second preferred embodiment is different from the first preferred embodiment in the die pattern and the micro lens pattern as well as the distance of the micro lenses.

Figure 7A:
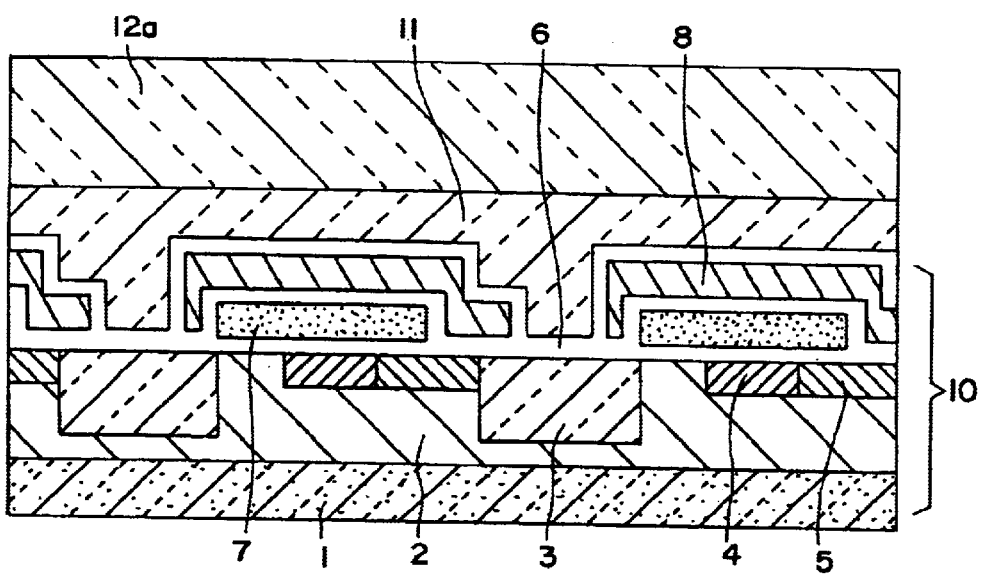
FIGS. 7A through 7D are fragmentary cross sectional elevation views illustrative of solid-state image pick-up devices involved in a fist method of forming an alignment of micro lenses over a base structure of the solid-state image pick-up device by use of a second novel die in a second preferred embodiment in accordance with the present invention.

With reference to FIG. 7A, a base structure 10 having the same structure as in the first preferred embodiment is formed in the same processes as described in the first preferred embodiment. A planarized insulation layer 11 is entirely formed over the base structure 10. The planarized insulation layer 11 may comprise either a silicon oxide layer or a transparent resin layer. The planarized insulation layer 11 is transparent to the light. Each gap between adjacent two of the shielding layers 8 is filled with the planarized insulation layer 11.

Further, a light-transmitting material layer 12a is formed on the planarized insulation layer 11. The light-transmitting material layer 12a may preferably comprise a transparent organic material layer, for example, a phenol novolak resin layer, a polyurethane resin layer, a polystyrene rein layer, a styrene-butadiene co-polymer rein layer, a polynorbornane resin layer, and a gelatin-casein layer.

Figure 7B:
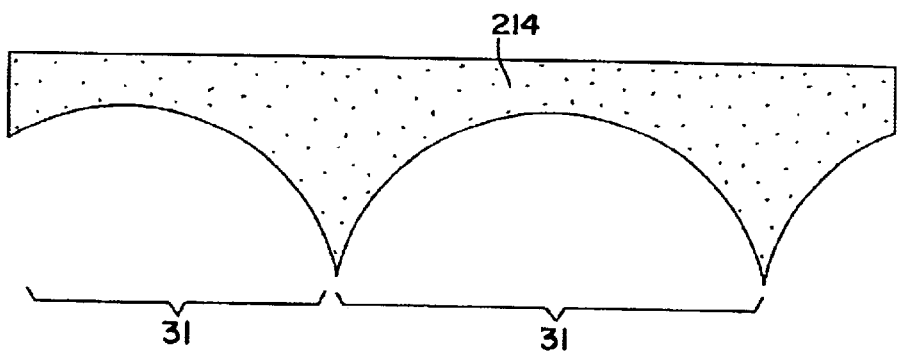
Figure 7B:
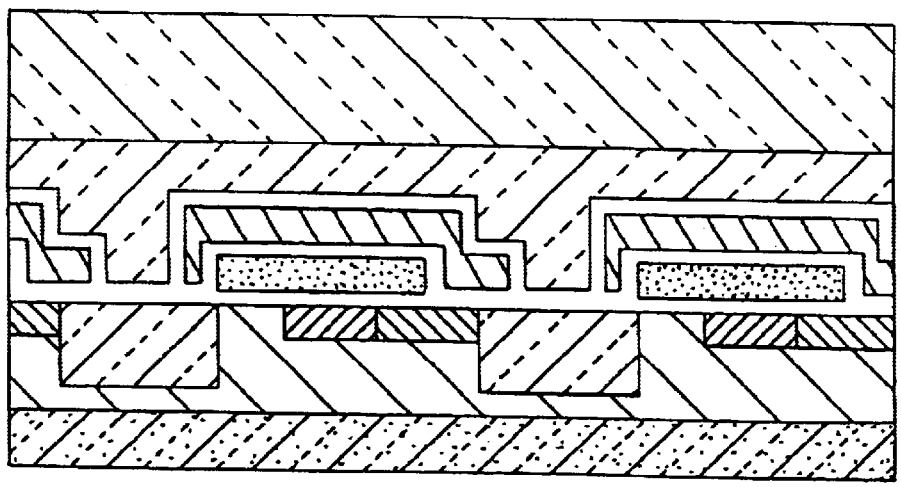

With reference to FIG. 7B, a die 214 having a die pattern is prepared. The die 214 is made of a material selected from the group consisting of tungsten, aluminum, copper, and alloys of those metals. Those substances are low in adhesiveness to the transparent organic material layer, whereby it is easy to remove the die 214 from the transparent organic material layer.

Figure 7C:
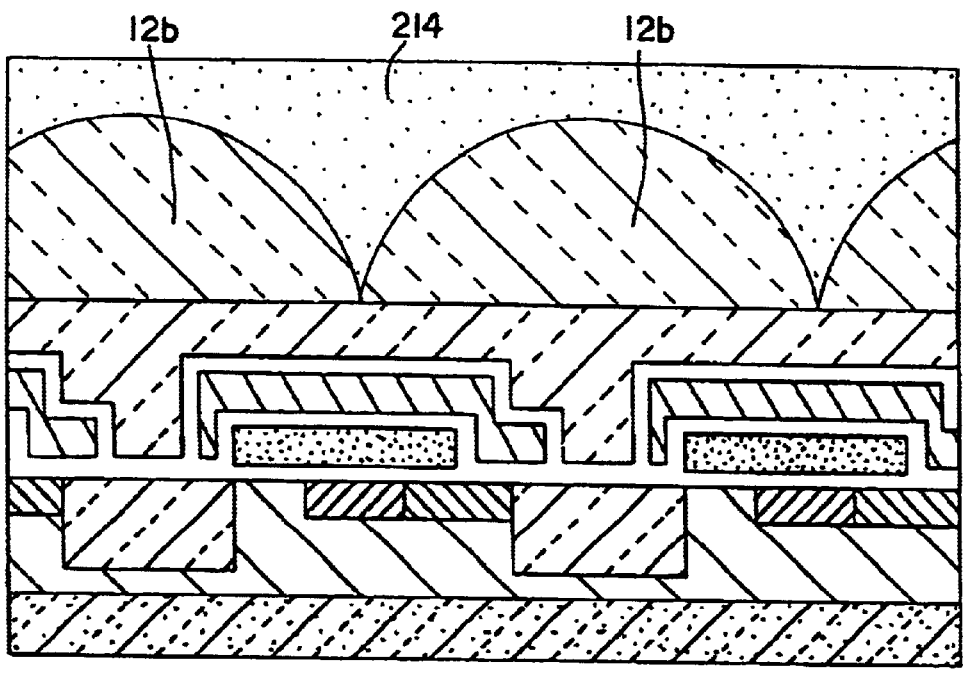

With reference to FIG. 7C, the die 214 having the die pattern is pushed against the light-transmitting material layer 12a to transfer the die pattern of the die 214 to the light-transmitting material layer 12a, thereby forming micro lens patterns 12b over the planarized insulation layer 11.

Figure 7D:
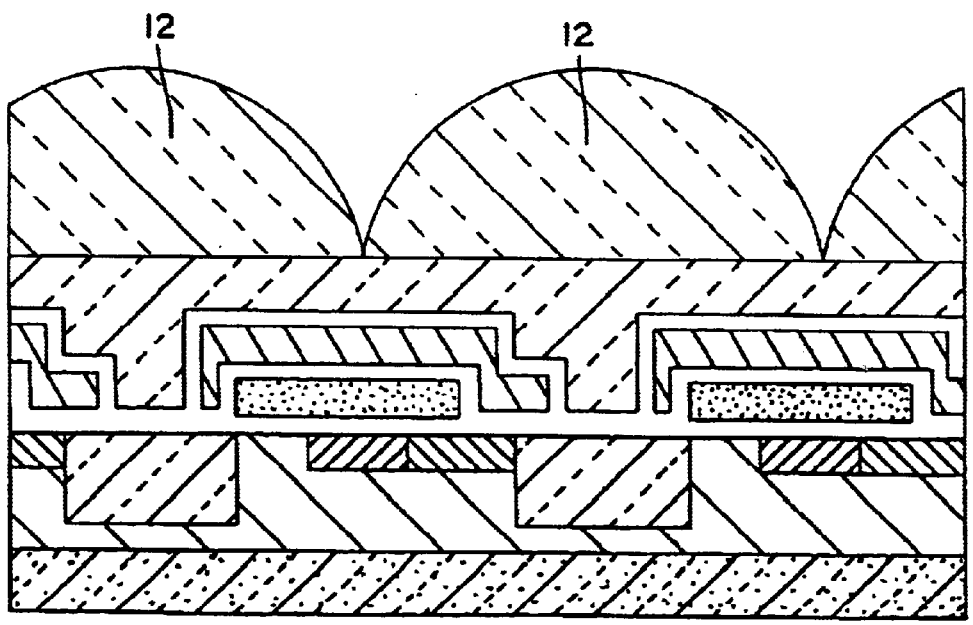

With reference to FIG. 7D, the micro lens patterns 12b are subjected to a thermo-setting process to form micro lenses 12. The thermo-setting process is carried out at a temperature in the range of 200–300° C. Alternatively, it is possible that the micro lens patterns 12b are subjected to a photo-curing process to form the micro lenses 12. Thereafter, the die 214 is removed from the micro lenses 12.

In this embodiment, the die 214 has a plurality of cavities having corresponding patterns to the micro lens patterns 12b, and boundary ridge-lines isolating the cavities from each other, so that the micro lenses 12 are adjacent to each other. In order to improve the sensitivity, it is effective to enlarge the size of the micro lenses 12 and narrow the distance between the adjacent two of the micro lenses 12. The boundary ridge-lines isolating the cavities from each other further narrow the distance between the adjacent two of the micro lenses 12, so that the micro lenses 12 are adjacent to each other, thereby to improve the sensitivity of the solid-state image pick-up device.

Pushing the die 214 having the die pattern against the light-transmitting material layer 12a causes the deformation of the light-transmitting material layer 12a into the micro lens patterns 12b which have the same pattern as the die 214. Namely, the shape and size of the micro lens patterns 12b depends upon solely the shape and size of the die pattern.

No re-flow process is carried out to form the micro lens patterns 12b or to form the micro lenses 12. No re-flow process causes no variation in shape and size of the micro lenses 12. This means it easy to form the micro lenses 12 having highly accurate shape and size.

Further, the die pattern is to form micro lenses 12 uniform in shape and/or size from each other, but each of the micro lenses 12 is highly accurate in size and shape in accordance with the die pattern designed. Notwithstanding, it is also possible that the die pattern may be a pattern to form micro lenses 12 differing in shape and/or size from each other, but each of the micro lenses 12 is highly accurate in size and shape in accordance with the die pattern designed. Namely, it is easy to form micro lenses 12 differing in shape and/or size from each other, but each of the micro lenses 12 is highly accurate in size and shape in accordance with the die pattern designed.

Furthermore, pushing the die 214 having the die pattern against the light-transmitting material layer 12a on the base structure of the solid-state image pick-up device results in formation of the micro lens patterns 12b which are free of any thin base layered portion as described in the fourth conventional method. This means no increase in thickness of the micro lens patterns 12b, resulting in no increase of the distance of the micro lens from a photo receiving region in the base structure of the solid-state image pick-up device. The micro lens positioned on or near the center axis or center position of the solid-state image pick-up device, of course, receives the vertical incident of light, whereby the light entirely reaches the photo receiving region. The reduction in distance between the micro lens and the photo receiving region in the base structure of the solid-state image pick-up device increases the amount of the oblique-incident light which reaches the photo receiving region. As a result, the reduction in distance between the micro lens and the photo receiving region in the base structure of the solid-state image pick-up device avoids any substantive deterioration in sensitivity of the solid-state image pick-up device.

The light-transmitting material layer 12a is formed on the planarized layer 11 of the solid-state image pick-up device before the die 214 with the die pattern is pushed into the light-transmitting material layer 12a to transfer the die pattern to the light-transmitting material layer 12a, whereby the micro lens patterns 12b are formed on the base structure of the solid-state image pick-up device. Subsequently, the thermo-setting process is carried out for hardening the micro lens patterns 12b in order to form the micro lenses 12. No adhesion or contact process is carried out for adhering or contacting the hard micro lens patterns 12b or hard micro lens material onto the surface of the base structure of the solids-state image pick-up device. Accordingly, the micro lens patterns 12b are securely contact with the surface of the base structure of the solids-state image pick-up device without no adhesion or contact process. Further, surface of the base structure of the solids-state image pick-up device receives no damage nor wound. In case, a color filter is formed on the surface region of the base structure of the solids-state image pick-up device. However, as just described here, no adhesion or contact process is carried out for adhering or contacting the hard micro lens patterns 12b or hard micro lens material onto the surface of the base structure of the solids-state image pick-up device. Accordingly, surface of the color filter in the base structure of the solids-state image pick-up device receives no damage nor wound. No wound is projected on the screen. It is, therefore, unnecessary to modify the structure of the solid-state image pick-up device in order to avoid the wound. Namely, it is unnecessary to form or provide any outside wall over the substrate for supporting the micro lens patterns 12b in order to space the same from the surface of the base structure of the solid-state image pick-up device or the surface of the color filter. Accordingly, no inter-space different in refractive index of light from the micro lens patterns 12b and the color filter is formed between the micro lens patterns 12b and the surface of the base structure of the solid-state image pick-up device or the surface of the color filter. No formation of the inter-space makes it easy to design the shape and size of the micro lens and design the solid state image pick-up device. Further, no formation of the inter-space increases the distance between the micro lens and the photo-receiving region provided in the base structure of the solid-state image pick-up device. This means no increase in thickness of the micro lens patterns 12b, resulting in no increase of the distance of the micro lens from a photo receiving region in the base structure of the solid-state image pick-up device. The micro lens positioned on or near the center axis or center position of the solid-state image pick-up device, of course, receives the vertical incident of light, whereby the light entirely reaches the photo receiving region. The reduction in distance between the micro lens and the photo receiving region in the base structure of the solid-state image pick-up device increases the amount of the oblique-incident light which reaches the photo receiving region. As a result, the reduction in distance between the micro lens and the photo receiving region in the base structure of the solid-state image pick-up device avoids any substantive deterioration in sensitivity of the solid-state image pick-up device.

During the thermo-setting process, the micro lens patterns 12b are securely defined by the die 214 with the die patterns corresponding to the micro lens patterns 12b. The shape of the micro lens patterns 12b are 10 accurately kept by the die patterns of the die 214 during the thermo-setting process. As a result, the micro lenses 12 are exactly or accurately identical in shape and size with the micro lens patterns 12b.

The thermo-setting process is carried out at a temperature in the range of 200–300° C. If the thermo-setting process is carried out at a temperature of less than 200° C., then the hardening of the micro lens patterns 12b may be insufficient. If the thermo-setting process is carried out at a temperature of more than 300° C., then there is increased an interface state density between a semiconductor substrate and a silicon oxide film in the base structure of the solid-state image pick-up device. The increase in the interface state density on the interface causes an increase in dark current. Therefore, a yield of the solid-state image pick-up device is thus decreased. The above temperature range of 200–300° C. is preferable to obtain the effect of hardening the micro lens pattern without providing any influence to the solid-state image pick-up device, for example, without increasing the interface state density between the semiconductor substrate and the silicon oxide film in the base structure of the solid-state image pick-up device.

In place of the above thermo-setting process, it possible to carry out the photo-curing process for hardening the micro lens patterns 12b in order to form the micro lenses 12. No adhesion or contact process is carried out for adhering or contacting the hard micro lens patterns 12b or hard micro lens material onto the surface of the planarized layer 11 in the base structure 10 of the solids-state image pick-up device. Accordingly, the micro lens patterns 12b are securely contacted with the surface of the base structure of the solids-state image pick-up device without an adhesion or contact process. Further, surface of the base structure of the solids-state image pick-up device receives no damage nor wound. In case, a color filter may optionally be formed in the planarized layer 11 in the base structure 10 of the solids-state image pick-up device. It is also possible that in place of the planarized layer 11, the color filter is formed on the surface of the base structure 10 of the solids-state image pick-up device. However, as just described here, no adhesion or contact process is carried out for adhering or contacting the hard micro lens patterns 12b or hard micro lens material onto the surface of the base structure of the solids-state image pick-up device. Accordingly, surface of the color filter in the base structure of the solids-state image pick-up device receives no damage nor wound. No wound is projected on the screen. It is, therefore, unnecessary to modify the structure of the solid-state image pick-up device in order to avoid the wound. Namely, it is unnecessary to form or provide any outside wall over the substrate for supporting the micro lens patterns 12b in order to float the same from the surface of the base structure of the solid-state image pick-up device or the surface of the color filter. Accordingly, no inter-space different in refractive index of light from the micro lens patterns 12b and the color filter is formed between the micro lens patterns 12b and the surface of the base structure of the solid-state image pick-up device or the surface of the color filter. No formation of the inter-space makes it easy to design the shape and size of the micro lens and design the solid state image pick-up device. Further, no formation of the inter-space increases the distance between the micro lens and the photo-receiving region provided in the base structure 10 of the solid-state image pick-up device. This means no increase in thickness of the micro lens patterns 12b, resulting in no increase of the distance of the micro lens from a photo receiving region in the base structure 10 of the solid-state image pick-up device. The micro lens positioned on or near the center axis or center position of the solid-state image pick-up device, of course, receives the vertical incident of light, whereby the light entirely reaches the photo receiving region 3. The reduction in distance between the micro lens 12 and the photo receiving region 3 in the base structure 10 of the solid-state image pick-up device increases the amount of the oblique-incident light which reaches the photo receiving region 3. As a result, the reduction in distance between the micro lens 12 and the photo receiving region 3 in the base structure of the solid state image pick-up device avoids any substantive deterioration in sensitivity of the solid-state image pick-up device.

The light-transmitting material layer 12a on the planarized layer is thus pushed by the die 214 with the die pattern. This planarized surface, on which the light-transmitting material layer is formed, makes it easier to realize the highly accurate transfer of the die pattern into the light-transmitting material layer 12a and thus to realize formation of the micro lens patterns 12b which are highly accurate in shape and size in accordance with the die pattern of the die 214.

THIRD EMBODIMENT

A third embodiment according to the present invention will be described in detail with reference to the drawings. FIGS. 8A through 8D are fragmentary cross sectional elevation views illustrative of solid-state image pick-up devices involved in a first method of forming an alignment of micro lenses over a base structure of the solid-state image pick-up device by use of a third novel die in a third preferred embodiment in accordance with the present invention. This third preferred embodiment is different from the first preferred embodiment in the die pattern and the micro lens pattern as well as the distance of the micro lenses.

Figure 5A:
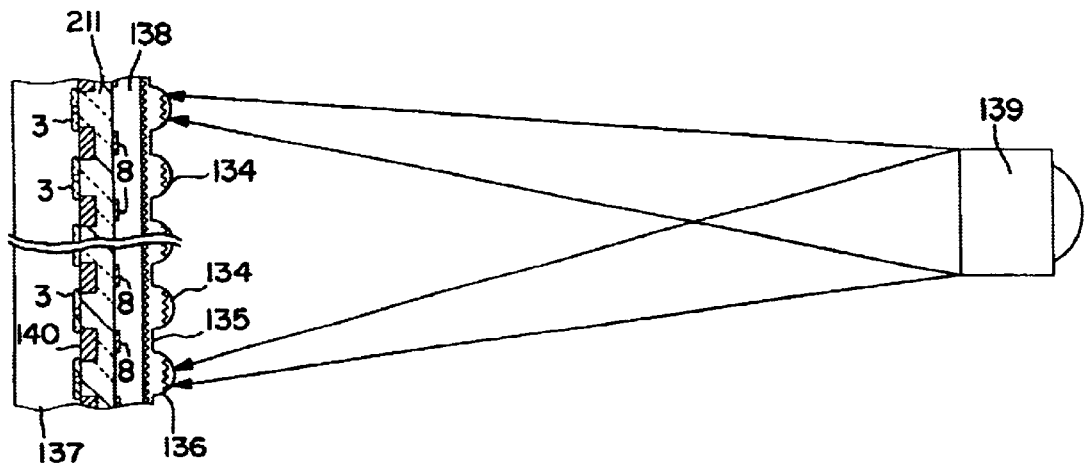
FIG. 5A is a view illustrative of an incidence of light through a camera lens into a solid-state image pick-up device having micro lenses formed in the fourth conventional methods illustrated in FIGS. 4A through 4E.
Figure 5B:
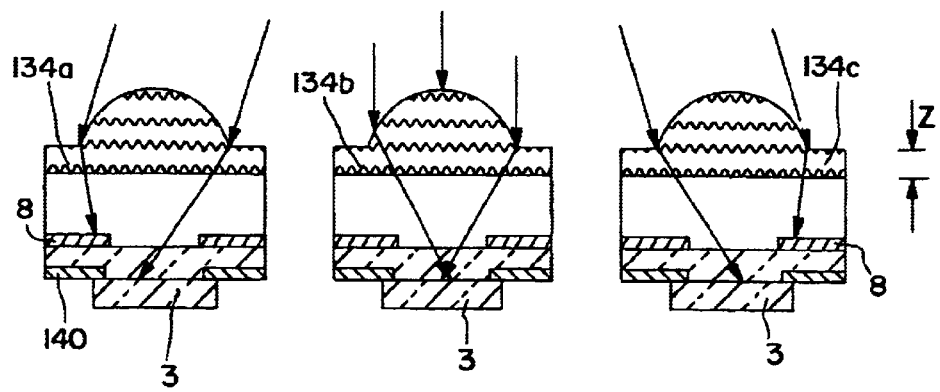
FIG. 5B is a view illustrative of an incident of the light through micro lenses into photo-diodes of the solid-state image pick-up device in FIG. 5A.

With reference to FIG. 5A, a base structure 10 having the same structure as in the first preferred embodiment is formed in the same processes as described in the first preferred embodiment A planarized insulation layer 11 is entirely formed over the base structure 10. The planarized insulation layer 11 may comprise either a silicon oxide layer or a transparent resin layer. The planarized insulation layer 11 is transparent to the light. Each gap between adjacent two of the shielding layers 8 is filled with the planarized insulation layer 11.

Further, a light-transmitting material layer 12a is formed on the planarized insulation layer 11. The light-transmitting material layer 12a may preferably comprise a transparent organic material layer, for example, a phenol novolak resin layer, a polyurethane resin layer, a polystyrene rein layer, a styrene-butadiene copolymer rein layer, a polyurethanane resin layer, and a gelatin-casein layer.

Figure 8A:
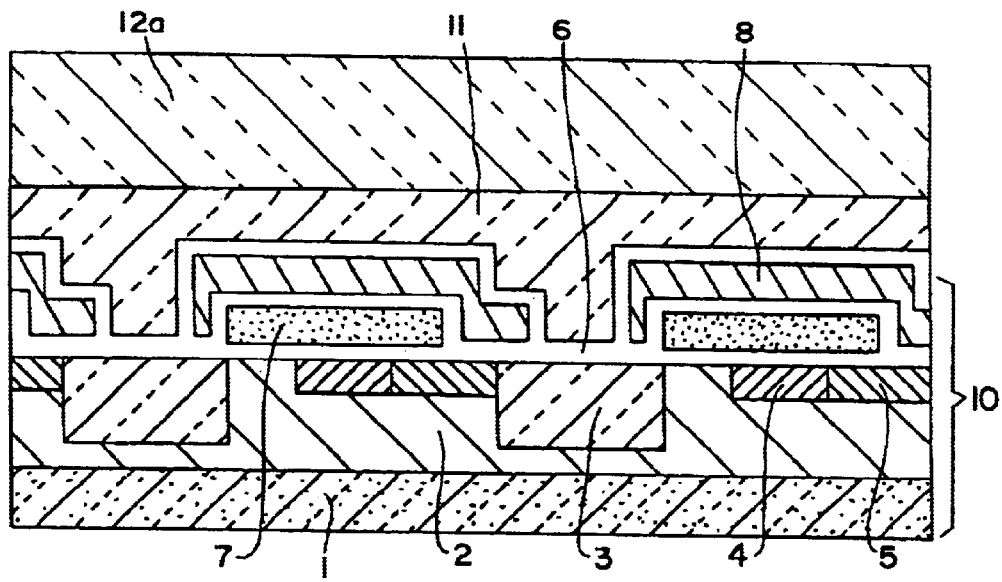
FIGS. 8A through 8D are fragmentary cross sectional elevation views illustrative of solid-state image pick-up devices involved in a first method of forming an alignment of micro lenses over a base structure of the solid-state image pick-up device by use of a third novel die in a third preferred embodiment in accordance with the present invention.
Figure 8B:
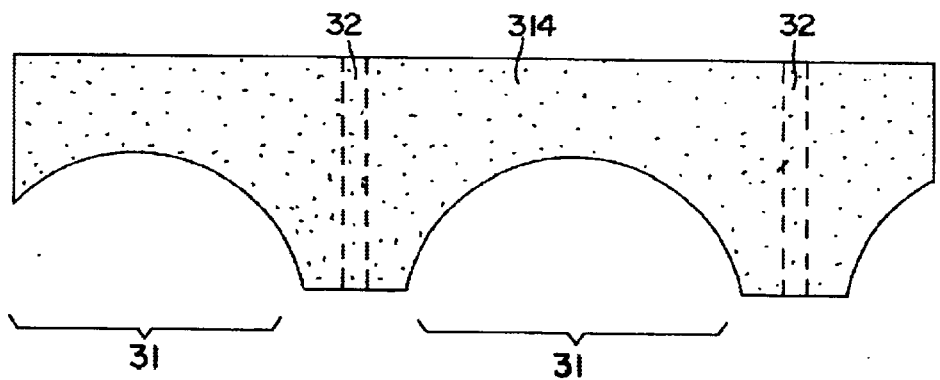
Figure 8B:
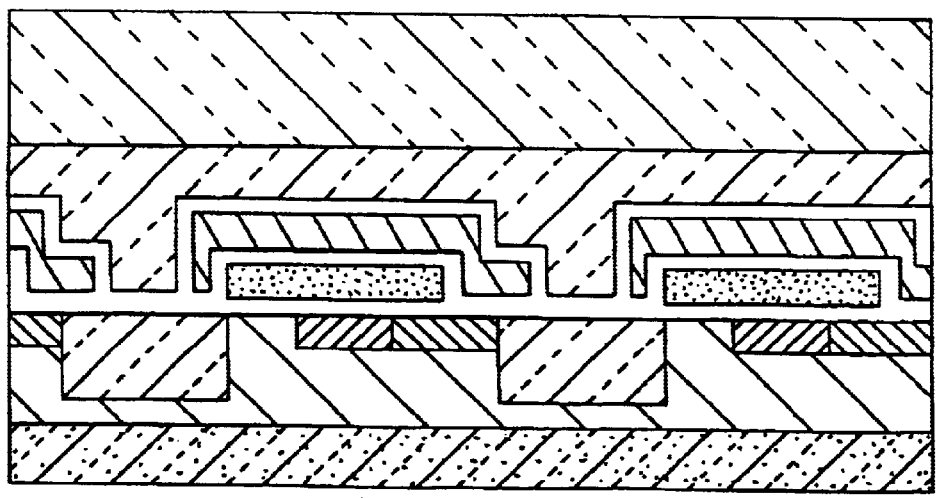

With reference to FIG. 8B, a die 214 having a die pattern is prepared. The die 214 is made of a material selected from the group consisting of tungsten, aluminum, copper, and alloys of those metals. Those substances are low in adhesiveness to the transparent organic material layer, whereby it is easy to remove the die 214 from the transparent organic material layer.

Figure 8C:
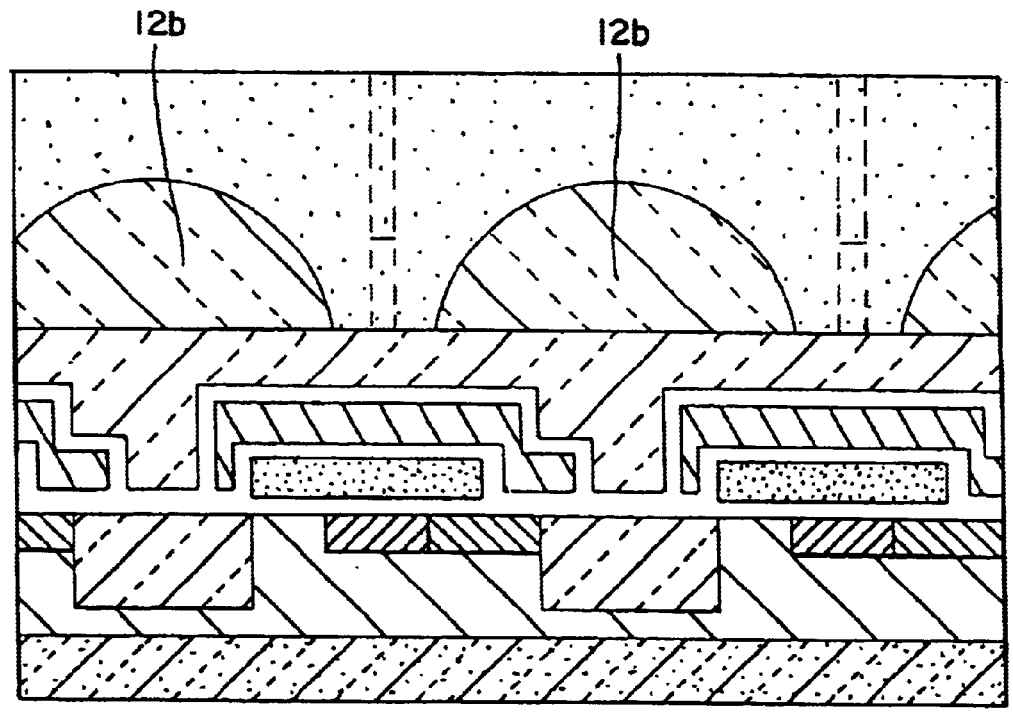

With reference to FIG. 8C, the die 314 having the die pattern is pushed against the light-transmitting material layer 12a to transfer the die pattern of the die 314 to the light-transmitting material layer 12a, thereby forming micro lens patterns 12b over the planarized insulation layer 11.

Figure 8D:
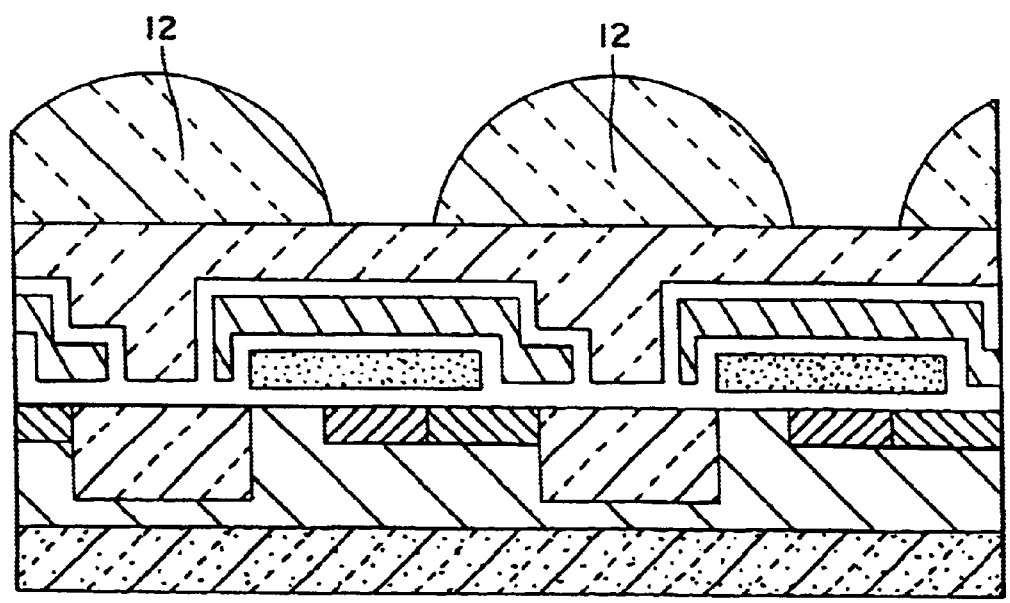

With reference to FIG. 8D, the micro lens patterns 12b are subjected to a thermo-setting process to form micro lenses 12. The thermo-setting process is carried out at a temperature in the range of 200–300° C. Alternatively, it is possible that the micro lens patterns 12b are subjected to a photo-curing process to form the micro lenses 12. Thereafter, the die 314 is removed from the micro lenses 12.

In this embodiment, the die 314 has a plurality of cavities having corresponding patterns to the micro lens patterns 12b, and boundary regions isolating the cavities from each other, so that the micro lenses 12 are distanced from each other. In this case, it is preferable that the boundary regions have escape portions for allowing part of the light-transmitting material layer 12a to be drawn into the escape portions. The escape portion may comprise a through hole. Alternatively, the escape portion may comprise a hollow portion. When the die 314 with the die pattern corresponding to the micro lens patterns 12b are pushed into the light-transmitting material layer 12a to transfer the die pattern into the light-transmitting material layer 12a, part of the light-transmitting material layer 12a does not enter into the cavity of the die 314, so that the part of the light-transmitting material layer 12a out of the cavity of the die 314 may be drawn into the escape portions of the die 314. No excess part of the light-transmitting material layer 12a is deformed or shaped by the die 314 into the micro lens patterns 12b, whereby the micro lens patterns 12b are highly accurate in shape and size in accordance with the die pattern of the die 314.

Pushing the die 314 having the die pattern against the light-transmitting material layer 12a causes the deformation of the light-transmitting material layer 12a into the micro lens patterns 12b which have the same pattern as the die 314. Namely, the shape and size of the micro lens patterns 12b depends upon solely the shape and size of the die pattern.

No re-flow process is carried out to form the micro lens patterns 12b or to form the micro lenses 12. No re-flow process causes no variation in shape and size of the micro lenses 12. This means it easy to form the micro lenses 12 having highly accurate shape and size.

Further, the die pattern is to form micro lenses 12 uniform in shape and/or size from each other, but each of the micro lenses 12 is highly accurate in size and shape in accordance with the die pattern designed. Notwithstanding, it is also possible that the die pattern may be a pattern to form micro lenses 12 differing in shape and/or size from each other, but each of the micro lenses 12 is highly accurate in size and shape in accordance with the die pattern designed. Namely, it is easy to form micro lenses 12 differing in shape and/or size from each other, but each of the micro lenses 12 is highly accurate in size and shape in accordance with the die pattern designed.

Furthermore, pushing the die 314 having the die pattern against the light-transmitting material layer 12a on the base structure of the solid-state image pick-up device results in formation of the micro lens patterns 12b which are free of any thin base layered portion as described in the fourth conventional method. This means no increase in thickness of the micro lens patterns 12b, resulting in no increase of the distance of the micro lens from a photo receiving region in the base structure of the solid-state image pick-up device. The micro lens positioned on or near the center axis or center position of the solid-state image pick-up device, of course, receives the vertical incident of light, whereby the light entirely reaches the photo receiving region. The reduction in distance between the micro lens and the photo receiving region in the base structure of the solid-state image pick-up device increases the amount of the oblique-incident light which reaches the photo receiving region. As a result, the reduction in distance between the micro lens and the photo receiving region in the base structure of the solid-state image pick-up device avoids any substantive deterioration in sensitivity of the solid-state image pick-up device.

The light-transmitting material layer 12a is formed on the planarized layer 11 of the solid-state image pick-up device before the die 314 with the die pattern is pushed into the light-transmitting material layer 12a to transfer the die pattern to the light-transmitting material layer 12a, whereby the micro lens patterns 12b are formed on the base structure of the solid-state image pick-up device. Subsequently, the thermo-setting process is carried out for hardening the micro lens patterns 12b in order to form the micro lenses 12. No adhesion or contact process is carried out for adhering or contacting the hard micro lens patterns 12b or hard micro lens material onto the surface of the base structure of the solids-state image pick-up device. Accordingly, the micro lens patterns 12b are securely contact with the surface of the base structure of the solids-state image pick-up device without no adhesion or contact process. Further, surface of the base structure of the solids-state image pick-up device receives no damage nor wound. In case, a color filter is formed on the surface region of the base structure of the solids-state image pick-up device. However, as just described here, no adhesion or contact process is carried out for adhering or contacting the hard micro lens patterns 12b or hard micro lens material onto the surface of the base structure of the solids-state image pick-up device. Accordingly, surface of the color filter in the base structure of the solids-state image pick-up device receives no damage nor wound. No wound is projected on the screen. It is, therefore, unnecessary to modify the structure of the solid-state image pick-up device in order to avoid the wound. Namely, it is unnecessary to form or provide any outside wall over the substrate for supporting the micro lens patterns 12b in order to space the same from the surface of the base structure of the solid-state image pick-up device or the surface of the color filter. Accordingly, no inter-space different in refractive index of light from the micro lens patterns 12b and the color filter is formed between the micro lens patterns 12b and the surface of the base structure of the solid-state image pick-up device or the surface of the color filter. No formation of the inter-space makes it easy to design the shape and size of the micro lens and design the solid state image pick-up device. Further, no formation of the inter-space increases the distance between the micro lens and the photo-receiving region provided in the base structure of the solid-state image pick-up device. This means no increase in thickness of the micro lens patterns 12b, resulting in no increase of the distance of the micro lens from a photo receiving region in the base structure of the solid-state image pick-up device. The micro lens positioned on or near the center axis or center position of the solid-state image pick-up device, of course, receives the vertical incident of light, whereby the light entirely reaches the photo receiving region. The reduction in distance between the micro lens and the photo receiving region in the base structure of the solid-state image pick-up device increases the amount of the oblique-incident light which reaches the photo receiving region. As a result, the reduction in distance between the micro lens and the photo receiving region in the base structure of the solid-state image pick-up device avoids any substantive deterioration in sensitivity of the solid-state image pick-up device.

During the thermosetting process, the micro lens patterns 12b are securely defined by the die 314 with the die patterns corresponding to the micro lens patterns 12b. The shape of the micro lens patterns 12b are accurately kept by the die patterns of the die 314 during the thermo-setting process. As a result, the micro lenses 12 are exactly or accurately identical in shape and size with the micro lens patterns 12b.

The thermo-setting process is carried out at a temperature in the range of 200–300° C. If the thermo-setting process is carried out at a temperature of less than 200° C., then the hardening of the micro lens patterns 12b may be insufficient. If the thermo-setting process is carried out at a temperature of more than 300° C., then there is increased an interface state density between a semiconductor substrate and a silicon oxide film in the base structure of the solid-state image pick-up device. The increase in the interface state density on the interface causes an increase in dark current. Therefore, a yield of the solid-state image pick-up device is thus decreased. The above temperature range of 200–300° C. is preferable to obtain the effect of hardening the micro lens pattern without providing any influence to the solid-state image pick-up device, for example, without increasing the interface state density between the semiconductor substrate and the silicon oxide film in the base structure of the solid-state image pick-up device.

In place of the above thermo-setting process, it possible to carry out the photo-curing process for hardening the micro lens patterns 12b in order to form the micro lenses 12. No adhesion or contact process is carried out for adhering or contacting the hard micro lens patterns 12b or hard micro lens material onto the surface of the planarized layer 11 in the base structure 10 of the solids-state image pick-up device. Accordingly, the micro lens patterns 12b are securely contacted with the surface of the base structure of the solids-state image pick-up device without an adhesion or contact process. Further, surface of the base structure of the solids-state image pick-up device receives no damage nor wound. In case, a color filter may optionally be formed in the planarized layer 11 in the base structure 10 of the solids-state image pick-up device. It is also possible that in place of the planarized layer 11, the color filter is formed on the surface of the base structure 10 of the solids-state image pick-up device. However, as just described here, no adhesion or contact process is carried out for adhering or contacting the hard micro lens patterns 12b or hard micro lens material onto the surface of the base structure of the solids-state image pick-up device. Accordingly, surface of the color filter in the base structure of the solids-state image pick-up device receives no damage nor wound. No wound is projected on the screen. It is, therefore, unnecessary to modify the structure of the solid-state image pick-up device in order to avoid the wound. Namely, it is unnecessary to form or provide any outside wall over the substrate for supporting the micro lens patterns 12b in order to float the same from the surface of the base structure of the solid-state image pick-up device or the surface of the color filter. Accordingly, no inter-space different in refractive index of light from the micro lens patterns 12b and the color filter is formed between the micro lens patterns 12b and the surface of the base structure of the solid-state image pick-up device or the surface of the color filter. No formation of the inter-space makes it easy to design the shape and size of the micro lens and design the solid state image pick-up device. Further, no formation of the inter-space increases the distance between the micro lens and the photo-receiving region provided in the base structure 10 of the solid-state image pick-up device. This means no increase in thickness of the micro lens patterns 12b, resulting in no increase of the distance of the micro lens from a photo receiving region in the base structure 10 of the solid-state image pick-up device. The micro lens positioned on or near the center axis or center position of the solid-state image pick-up device, of course, receives the vertical incident of light, whereby the light entirely reaches the photo receiving region 3. The reduction in distance between the micro lens 12 and the photo receiving region 3 in the base structure 10 of the solid-state image pick-up device increases the amount of the oblique-incident light which reaches the photo receiving region 3. As a result, the reduction in distance between the micro lens 12 and the photo receiving region 3 in the base structure of the solid-state image pick-up device avoids any substantive deterioration in sensitivity of the solid-state image pick-up device.

The light-transmitting material layer 12a on the planarized layer is thus pushed by the die 314 with the die pattern. This planarized surface, on which the light-transmitting material layer is formed, makes it easier to realize the highly accurate transfer of the die pattern into the light-transmitting material layer 12a and thus to realize formation of the micro lens patterns 12b which are highly accurate in shape and size in accordance with the die pattern of the die 314.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming micro lenses over a base structure of a solid state image pick-up device, said method comprising the steps of:

forming a light-transmitting material layer on said base structure; and pushing a die having a die pattern against said light-transmitting material layer to transfer only said die pattern of said die directly to said light-transmitting material layer, thereby forming micro lens patterns free of a supporting wall over said base structure.

2. The method as claimed in claim 1, further comprising the step of subjecting said micro lens patterns to a thermo-setting process to form micro lenses.

3. The method as claimed in claim 2, wherein said thermo-setting process is carried out before said die is removed from said micro lenses.

4. The method as claimed in claim 2, wherein said thermo-setting process is cared out at a temperature in the range of 200–300° C.

5. The method as claimed in claim 1, further comprising the step of subjecting said micro lens patterns to a photo-curing process to form micro lenses.

6. The method as claimed in claim 1, wherein said light-transmitting material layer comprises a transparent organic material layer.

7. The method as claimed in claim 1, wherein said die is made of a metal selected from the group consisting of tungsten, aluminum, copper, and an alloy thereof.

8. The method as claimed in claim 1, wherein said die has a plurality of cavities having corresponding patterns to said micro lens patterns, and boundary regions isolating said cavities from each other, so that said micro lenses are distanced from each other.

9. The method as claimed in claim 8, wherein said boundary regions have escape portions for allowing part of said light-transmitting material layer to be drawn into said escape portions.

10. The method as claimed in claim 9, wherein said escape portion comprises a through hole.

11. The method as claimed in claim 9, wherein said escape portion comprises a hollow portion.

12. The method as claimed in claim 1, wherein said die has a plurality of cavities having corresponding patterns to said micro lens patterns, and boundary ridge-lines isolating said cavities from each other, so that said micro lenses are adjacent to each other.

13. The method as claimed in claim 1, further comprising the step of forming a planarized layer on said base structure before said light-transmitting material layer is then formed on said planarized layer.

14. The method as claimed in claim 13, wherein a color filer layer is formed in said planarized layer.

15. A method of forming a solid state image pick-up device, said method comprising the steps of:
    forming a base structure over a semiconductor substrate, and said base structure having photo-diodes;
    forming a light-transmitting material layer on said base structure; and
    pushing a die having a die pattern against said light-transmitting material layer to transfer only said die pattern of said die directly to said light-transmitting material layer, thereby forming discrete micro lens patterns free of a supporting wall over said base structure.

16. The method as claimed in claim 15, further comprising the step of subjecting said micro lens patterns to a thermo-setting process to form micro lenses.

17. The method as claimed in claim 16, wherein said thermo-setting process is carried out before said die is removed from said micro lenses.

18. The method as claimed in claim 16, wherein said thermo-setting process is carried out at a temperature in the range of 200–300°C.

19. The method as claimed in claim 15, further comprising the step of subjecting said micro lens patterns to a photo-curing process to form micro lenses.

20. The method as claimed in claim 15, wherein said light-transmitting material layer comprises a transparent organic material layer.

21. The method as claimed in claim 15, wherein said die is made of a metal selected from the group consisting of tungsten, aluminum, copper, and an alloy thereof.

22. The method as claimed in claim 15, wherein said die has a plurality of cavities having corresponding patterns to said micro lens patterns, and boundary regions isolating said cavities from each other, so that said micro lenses are distanced from each other.

23. The method as claimed in claim 22, wherein said boundary regions have escape portions for allowing part of said light-transmitting material layer to be drawn into said escape portions.

24. The method as claimed in claim 23, wherein said escape portion comprises a through hole.

25. The method as claimed in claim 23, wherein said escape portion comprises a hollow portion.

26. The method as claimed in claim 15, wherein said die has a plurality of cavities having corresponding patterns to said micro lens patterns, and boundary ridge-lines isolating said cavities from each other, so that said micro lenses are adjacent to each other.

27. The method as claimed in claim 15, further comprising the step of forming a planarized layer on said base structure before said light-transmitting material layer is then formed on said planarized layer.

28. The method as claimed in claim 27, wherein a color filer layer is formed in said planarized layer.

29. A method of forming micro lenses over a base structure of a solid state image pick-up device, said method comprising the steps of:
    forming a light-transmitting material layer on said base structure; and
    pushing a die having a die pattern against said light-transmitting material layer to transfer said die pattern of said die to said light-transmitting material layer, thereby forming micro lens patterns free of a base layer portion over said base structure.

30. The method as claimed in claim 29, further comprising the step of subjecting said micro lens patterns to a thermo-setting process to form micro lenses.

31. The method as claimed in claim 30, wherein said thermo-setting process is carried out before said die is removed from said micro lenses.

32. The method as claimed in claim 30, wherein said thermo-setting process is carried out at a temperature in the range of 200–300° C.

33. The method as claimed in claim 29, further comprising the step of subjecting said micro lens patterns to a photo-curing process to form micro lenses.

34. The method, as claimed in claim 29, wherein said light-transmitting material layer comprises a transparent organic material layer.

35. The method as claimed in claim 29, wherein said die is made of a metal selected from the group consisting of tungsten, aluminum, copper and an alloy thereof.

36. The method as claimed in claim 29, wherein said die has a plurality of cavities having corresponding patterns to said micro lens patterns, and boundary regions isolating said cavities from each other, so that said micro lenses are distanced from each other.

37. The method as claimed in claim 36, wherein said boundary regions have escape portions for allowing part of said light-transmitting material layer to be drawn into said escape portions.

38. The method as claimed in claim 37, wherein said escape portion comprises a through hole.

39. The method as claimed in claim 37, wherein said escape portion comprises a hollow portion.

40. The method as claimed in claim 29, wherein said die has a plurality of cavities having corresponding patterns to said micro lens patterns, and boundary ridge-lines isolating said cavities from each other, so that said micro lenses are adjacent to each other.

41. The method as claimed in claim 29, further comprising the step of forming a planarized layer on said base structure before said light-transmitting material layer is then formed on said planarized layer.

42. The method as claimed in claim 41, wherein a color filter layer is formed in said planarized layer.

43. A method of forming a solid state image pick-up device, said method comprising the steps of:

forming a base structure over a semiconductor substrate, and said base structure having photo-diodes;

forming a light-transmitting material layer on said base structure; and pushing a die having a die pattern against said light-transmitting material layer to transfer said die pattern of said die to said light-transmitting material layer, thereby forming micro lens patterns free of a base layer portion over said base structure.

44. The method as claimed in claim 43, further comprising the step of subjecting said micro lens patterns to a thermo-setting process to form micro lenses.

45. The method as claimed in claim 44, wherein said thermo-setting process is carried out before said die is removed from said micro lenses.

46. The method as claimed in claim 44, wherein said thermo-setting process is carried out at a temperature in the range of 200–300° C.

47. The method as claimed in claim 43, further comprising the step of subjecting said micro lens patterns to a photo-curing process to form micro lenses.

48. The method as claimed in claim 43, wherein said light-transmitting material layer comprises a transparent organic material layer.

49. The method as claimed in claim 43, wherein said die is made of a metal selected from the group consisting of tungsten, aluminum, copper, and an alloy thereof.

50. The method as claimed in claim 43, wherein said die has a plurality of cavities having corresponding patterns to said micro lens patterns, and boundary regions isolating said cavities from each other, so that said micro lenses are distanced from each other.

51. The method as claimed in claim 50, wherein said boundary regions have escape portions for allowing part of said light-transmitting material layer to be drawn into said escape portions.

52. The method as claimed in claim 51, wherein said escape portion comprises a through hole.

53. The method as claimed in claim 51, wherein said escape portion comprises a hollow portion.

54. The method as claimed in claim 43, wherein said die has a plurality of cavities having corresponding patterns to said micro lens patterns, and boundary ridge-lines isolating said cavities from each other, so that said micro lenses are adjacent to each other.

55. The method as claimed in claim 43, further comprising the step of forming a planarized layer en said base structure before said light-transmitting material layer is then formed on said planarized layer.

56. The method as claimed in claim 43, wherein a color filter layer is formed in said planarized layer.

* * * * *